(12) United States Patent
Kurokawa

(10) Patent No.: US 8,248,131 B2
(45) Date of Patent: Aug. 21, 2012

(54) TIMING GENERATING CIRCUIT AND PHASE SHIFT CIRCUIT

(75) Inventor: Fujio Kurokawa, Nagasaki (JP)

(73) Assignee: Nagasaki University, National University Corporation, Nagasaki (JP)

( * ) Notice: Subject to any disclaimer, the term of this patent is extended or adjusted under 35 U.S.C. 154(b) by 0 days.

(21) Appl. No.: 12/665,396

(22) PCT Filed: Jun. 1, 2008

(86) PCT No.: PCT/JP2008/060085
§ 371 (c)(1),
(2), (4) Date: Jun. 7, 2010

(87) PCT Pub. No.: WO2009/001652
PCT Pub. Date: Dec. 31, 2008

(65) Prior Publication Data
US 2010/0253408 A1   Oct. 7, 2010

(30) Foreign Application Priority Data

Jun. 18, 2007   (JP) .................................. 2007-159611
Aug. 1, 2007   (JP) .................................. 2007-200249

(51) Int. Cl.
*H03K 5/13*   (2006.01)
(52) U.S. Cl. ...................... 327/231; 327/324; 327/151
(58) Field of Classification Search .................. 327/144, 327/151, 153, 160, 161, 231, 233, 234
See application file for complete search history.

(56) References Cited

U.S. PATENT DOCUMENTS

| | | | | |
|---|---|---|---|---|
| 6,690,216 | B2* | 2/2004 | Lutkemeyer | 327/161 |
| 7,282,973 | B1* | 10/2007 | Charagulla et al. | 327/158 |
| 2008/0232178 | A1* | 9/2008 | Aoki | 365/193 |

FOREIGN PATENT DOCUMENTS

| JP | 09-186682 A | 7/1997 |
|---|---|---|
| JP | 2003-202936 A | 7/2003 |

OTHER PUBLICATIONS

International Search Report, Appln. No. PCT/JP2008/060085, dated Nov. 18, 2008.

* cited by examiner

*Primary Examiner* — An Luu
(74) *Attorney, Agent, or Firm* — Kile Park Goekjian Reed & McManus PLLC

(57) ABSTRACT

There are provided a timing generating circuit which can generate the rising edge or the falling edge of pulses with a resolution higher than the frequency of a repeat signal generating circuit, and a phase shift circuit which can be applied to the timing generating circuit. The phase shift circuit receiving a repeat signal generates a signal of which a phase is shifted by a predetermined quantity on the basis of the repeat signal, the phase shift controller controls what phase of signal the phase shift circuit output among first to M-th signals, and the counter circuit counts the number of output signals of the phase shift circuit and generates a count end signal when the count value reaches a set value, and thereby the counter circuit outputs a synthesized timing signal of the timing of the repeat signal and the timing shifted by the phase shift circuit.

6 Claims, 38 Drawing Sheets

Fig. 16
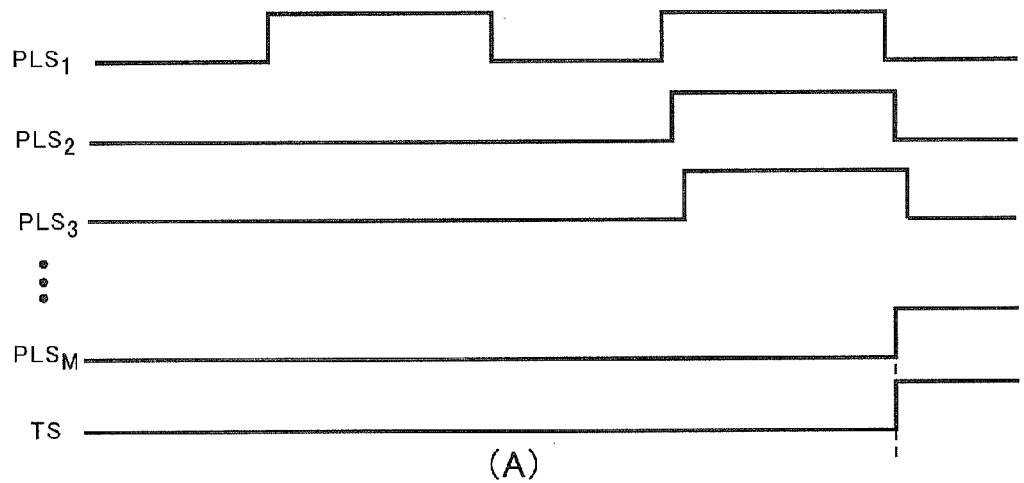
(A)
(B)

Fig. 31

|     | $S_{A1}$ | $S_{A2}$ | $S_{A3}$ | $S_{A4}$ | $S_{B1}$ | $S_{B2}$ | $S_{B3}$ | $S_{B4}$ |
|-----|-----|-----|-----|-----|-----|-----|-----|-----|
| 0   | ON  | OFF | OFF | OFF | ON  | OFF | OFF | OFF |
| T   | OFF | OFF | OFF | OFF | ON  | OFF | OFF | OFF |
| 2T  | ON  | OFF | OFF | OFF | OFF | ON  | OFF | OFF |
| 3T  | OFF | OFF | OFF | OFF | OFF | ON  | OFF | OFF |
| 4T  | ON  | ON  | OFF | OFF | OFF | OFF | ON  | OFF |
| 5T  | OFF | ON  | OFF | OFF | OFF | OFF | ON  | OFF |
| 6T  | ON  | OFF | OFF | OFF | OFF | OFF | ON  | OFF |
| 7T  | OFF | OFF | OFF | OFF | OFF | OFF | ON  | OFF |
| 8T  | ON  | ON  | ON  | OFF | OFF | OFF | OFF | ON  |
| 9T  | OFF | ON  | ON  | OFF | OFF | OFF | OFF | ON  |
| 10T | OFF | OFF | ON  | OFF | ON  | OFF | OFF | ON  |
| 11T | OFF | OFF | ON  | OFF | OFF | OFF | OFF | ON  |
| 12T | ON  | ON  | OFF | OFF | OFF | OFF | OFF | ON  |
| 13T | OFF | OFF | ON  | OFF | OFF | OFF | OFF | ON  |
| 14T | OFF | ON  | OFF | OFF | OFF | OFF | OFF | ON  |
| 14T | OFF | OFF | OFF | OFF | OFF | OFF | OFF | ON  |

Fig. 36
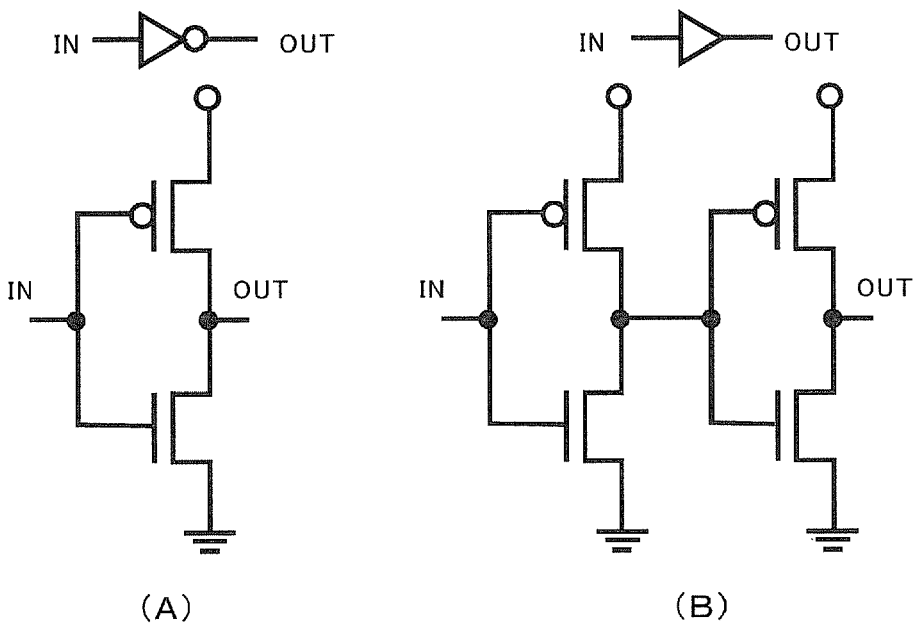
(A) (B)
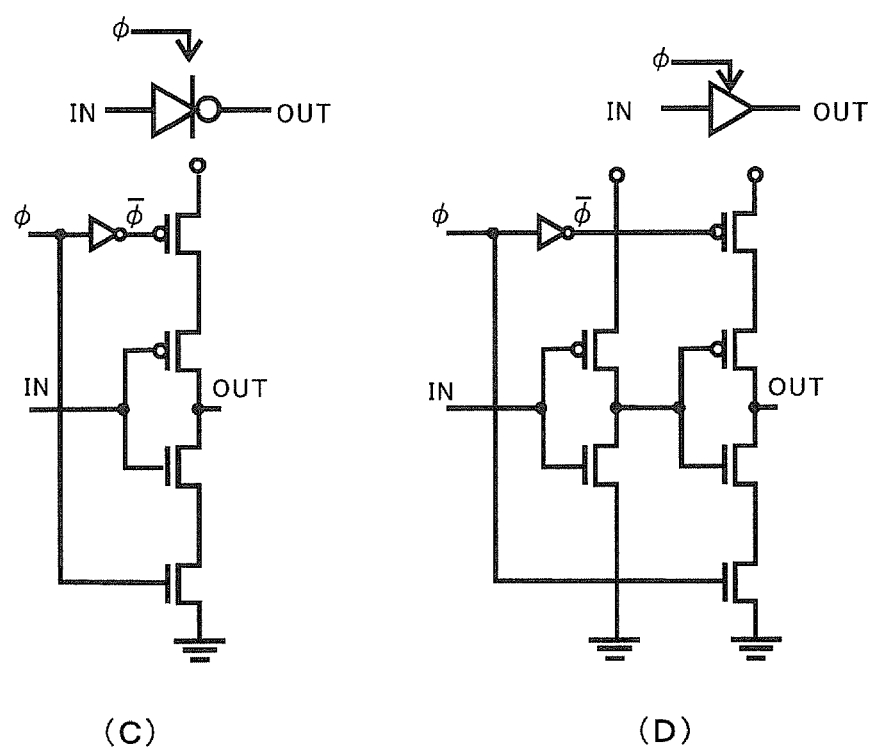
(C) (D)

Fig. 37
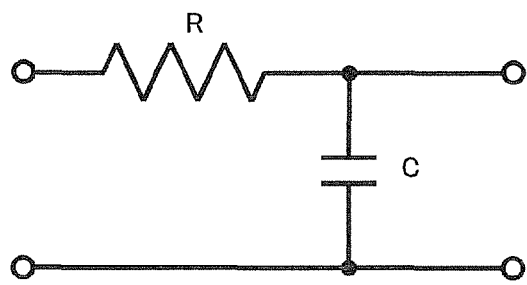
(A)
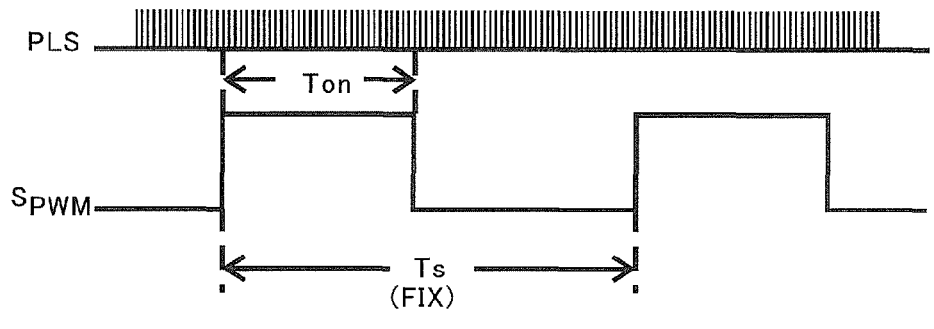
(B)
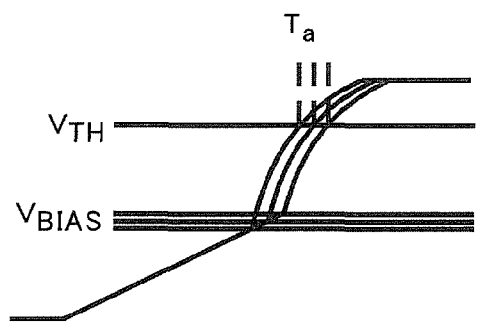
(C)

Fig. 38
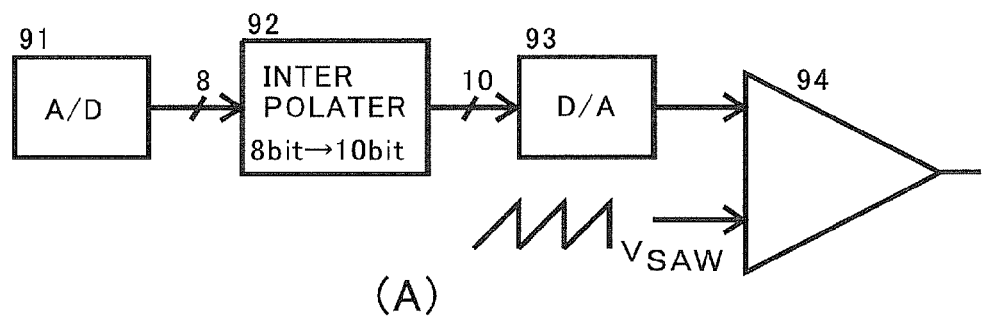
(A)
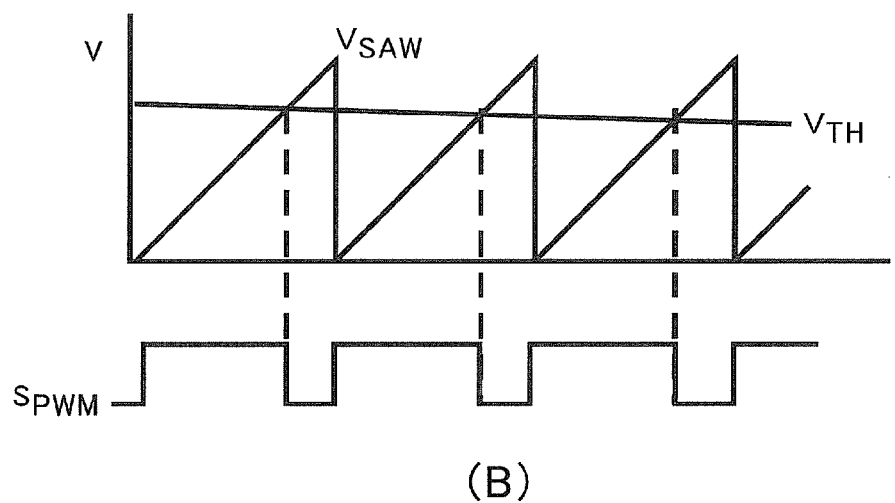
(B)

US 8,248,131 B2

TIMING GENERATING CIRCUIT AND PHASE SHIFT CIRCUIT

TECHNICAL FIELD

The present invention relates to a circuit technique of generating a predetermined timing (such as period, ON time, OFF time, duty ratio, dead time, and ratio of dead time to period) of a processing signal and, more particularly, to a timing generating circuit which can generate the rising edge or the falling edge of pulses with a resolution higher than the frequency of a repeat signal generating circuit, and a phase shift circuit which can be applied to the timing generating circuit.

BACKGROUND ART

Conventionally, in an apparatus containing with a PWM function and an apparatus processing pulses such as VCO, there has been attempted to set timing of ON width, OFF width, duty ratio, dead time, or time width such as period of the pulse more finely than the frequency of a transmitter circuit. As for this kind of technique, for example, a technique has been known in which a rising timing of the pulse is shifted using an RC integration circuit as shown in FIG. 37(A). Specifically, as shown in FIG. 37(B), a capacitor C is charged before one period $T_S$ of a pulse signal starts (before a predetermined time of the rising timing of the pulse), and when the charging voltage $V_{BIAS}$ reaches a threshold voltage $V_{TH}$ (see timing $T_a$, shown in FIG. 37(C)), the rising timing of the pulse is set (starting of $T_{ON}$ period). In the technique, as shown in FIG. 37(C), the start timing Ta of the $T_{ON}$ period can be adjusted with high accuracy of a clock CLK (see FIG. 37(B)) by changing the charging voltage $V_{BIAS}$ of the capacitor C.

DISCLOSURE OF THE INVENTION

Problem to be Solved by the Invention

However, in the technique shown in FIG. 37, the charging voltage of the capacitor C cannot be constantly maintained because the characteristics of the elements are not constant. For this reason, it is not easy to generate a timing signal at a high frequency.

In addition, there may be considered a circuit which operates at high frequency by interpolating and expanding the number of bits. The circuit includes an A/D converter 91, an interpolation expander 92, a D/A converter 93, and a comparator 94. The number of bits of the signal (8 bits in this example) from the A/D converter 91 is expanded (10 bits expansion in this example) by an interpolation expander 92.

The 10-bit signal which is interpolated and expanded is converted into an analog signal $V_A$ by the D/A converter 93, and compared with a saw signal $V_{SAW}$ by the comparator 94 which outputs a PWM-modulated pulse signal $S_{SPWM}$. FIG. 38(B) shows the analog signal $V_A$, the saw signal $V_{SAW}$, and the pulse signal $S_{PWM}$.

However, in the scheme, the timing cannot be adjusted at a high frequency. In addition, since the comparator of the analog saw signal is used, it is susceptible to noise.

An object of the invention is to provide a circuit technique of generating a predetermined timing (such as period, ON time, OFF time, duty ratio, dead time, and ratio of dead time to period) of a processing signal, and more particularly, to provide a timing generating circuit and a phase shift circuit to be employed to the timing generating circuit, in which the rising edge or the falling edge of the pulse can be generated at timing more finely than that of frequency of a repeat signal generating circuit.

Means for Solving the Problem

The gist of the timing generating circuit according to the invention is the following configurations (1) to (12).

(1)
A timing generating circuit generating a predetermined timing of a processing signal, comprising a phase shift circuit, a phase shift controller, and a counter circuit, wherein
(A) the phase shift circuit receiving a repeat signal outputs a signal of which a phase is shifted by a predetermined quantity (including a zero shift quantity) on the basis of the repeat signal,
(B) the phase shift controller controls what phase of signal the phase shift circuit output (where the first signal has a zero shift quantity and the M-th signal has the maximum shift quantity) among first to M-th signals, and
(C) the counter circuit counts the number of output signals of the phase shift circuit and generates a count end signal when the count value reaches a set value,
whereby the counter circuit outputs a synthesized timing signal of the timing of the repeat signal and the timing shifted by the phase shift circuit.

According to the invention, in consideration of power saving, the upper cipher is counted by the counter circuit, and the lower cipher is counted by the phase shift circuit.

(2)
A timing generating circuit generating a predetermined timing of a processing signal, comprising a counter circuit, a phase shift circuit, and a phase shift controller, wherein
(A) the counter circuit receiving a repeat signal counts the number of repeat signals and generates a count end signal when the count value reaches a set value,
(B) the phase shift circuit outputs a signal of which a phase is shifted by a predetermined quantity (including a zero shift quantity) from the output signal of the counter circuit, and
(C) the phase shift controller controls what phase of signal (where the first signal has a zero shift quantity and the M-th signal has the maximum shift quantity) the phase shift circuit should output among first to M-th signals,
whereby the phase shift circuit outputs a synthesized timing signal of the timing of the repeat signal and the timing shifted by the phase shift circuit.

(3)
A timing generating circuit generating a predetermined timing of a processing signal, comprising a repeat signal generating circuit, a phase shift circuit generating plural signals of which a phase is shifted by a predetermined quantity (including a zero shift quantity), a selection circuit selecting one of plural signals from the phase shift circuits to correspond to a low cipher of a timing value, and a counter circuit having a set value corresponding to a high cipher of the timing value, wherein
(A) the phase shift circuit receives the output signal of the repeat signal generating circuit and outputs plural signals of which a phase is shifted by a predetermined quantity on the basis of the received signal, and
(B) the selection circuit selects and outputs one of plural signals from the phase shift circuit to correspond to a low-cipher value of the timing value and the counter circuit outputs a count end signal as a timing signal corresponding to a value obtained by combining the low-cipher value and the high-cipher value when the count value reaches a set value.

(4)

A timing generating circuit generating a predetermined timing of a processing signal, comprising a repeat signal generating circuit, a phase shift circuit generating plural signals of which a phase is shifted by a predetermined quantity (including a zero shift quantity), a counter circuit including plural counter circuit elements having a set value corresponding to a high cipher of the timing value, and a selection circuit selecting one of the signals from the plural counter circuit elements of the counter circuit to correspond to a low cipher of the timing value, wherein (A) the phase shift circuit receives the output signal of the repeat signal generating circuit and outputs plural signals of which a phase is shifted by a predetermined quantity on the basis of the received signal, and (B) the respective counter circuit elements of the counter circuit receive and count the plural output signals of the phase shift circuit and outputs count end signals when the count value reaches the set value, and the selection circuit selects one of the output signals of the plural counter circuit elements of the counter circuit on the basis of the low-cipher value and outputs the selected signal as a timing signal corresponding to a value obtained by combining the low-cipher value and the high-cipher value.

(5)

A timing generating circuit generating a predetermined timing of a processing signal, comprising a repeat signal generating circuit, a counter circuit having a set value corresponding to a high cipher of a timing value, a phase shift circuit generating plural signals of which a phase is shifted by a predetermined quantity (including a zero shift quantity), a selection circuit selecting one of the plural signals from the phase shift circuit to correspond to a low-cipher value of the timing value, and a selection circuit controller, wherein (A) the counter circuit receives and counts the output signal of the repeat signal generating circuit and outputs a count end signal when the count value reaches the set value, and (B) the phase shift circuit receives the count end signal of the counter circuit and outputs plural signals of which the phases are shifted by a predetermined quantity (including a zero shift quantity) on the basis of the received signal, and the selection circuit selects one of the plural output signals of the phase shift circuit to correspond to a low-cipher value and outputs the selected signal as a timing signal corresponding to a value obtained by combining the low-cipher value and the high-cipher value.

(6)

The timing generating circuit according to any one of (1) to (5), wherein the phase shift circuit includes a serial connection or a parallel connection of delay elements or delay circuits or a serial-parallel connection as a combination thereof.

(7)

The timing generating circuit according to any one of (3) to (5), wherein signals of which phases are sequentially shifted are output from terminals of the delay elements or the delay circuits.

(8)

The timing generating circuit according to any one of (3) to (5), further comprising a phase shift controller stopping the delay elements or the delay circuits not used among the operations of the delay elements or the delay circuits of the phase shift circuit.

(9)

A timing generating circuit generating a predetermined timing of a processing signal, comprising a repeat signal generating circuit outputting plural signals of which phases are shifted by a predetermined quantity (including a zero shift quantity), a counter circuit including plural counter circuit elements having a set value corresponding to a high cipher of a timing value, and a selection circuit selecting one of the plural signals from the counter circuit to correspond to a low cipher of the timing value, wherein (A) the plural counter circuit elements of the counter circuit receive and count the plural output signals of the repeat signal generating circuit and outputs a count end signal when the count value reaches the set value, and (B) the selection circuit selects one of the output signals of the plural counter circuit elements on the basis of the low-cipher value and outputs the selected signal as a timing signal corresponding to a value obtained by combining the low-cipher value and the high-cipher value.

(10)

A timing generating circuit generating a predetermined timing of a processing signal, comprising a repeat signal generating circuit outputting plural signals of which phases are shifted by a predetermined quantity (including a zero shift quantity), a selection circuit selecting one of the plural signals from the repeat signal generating circuit to correspond to a low-cipher value of a timing value, a counter circuit including plural counter circuit elements having a set value corresponding to a high cipher of the timing value, wherein (A) the selection circuit selects and outputs one of the plural output signals of the repeat signal generating circuit on the basis of the value corresponding to the low cipher, and (B) the counter circuit receives and counts the output signal of the selection circuit and outputs a count end signal as a timing signal corresponding to a value obtained by combining the low-cipher value and the high-cipher value when the count value reaches the set value.

(11)

The timing generating circuit according to (9) or (10), wherein the repeat signal generating circuit includes a repeat signal generating source and a phase shift circuit, and wherein the phase shift circuit receives the output of the repeat signal generating source and outputs plural signals of which phases are shifted by a predetermined quantity (including a zero shift quantity) on the basis of the repeat signal.

(12)

The timing generating circuit according to (11), wherein the phase shift circuit includes a serial connection or a parallel connection of delay elements or delay circuits or a serial-parallel connection as a combination thereof and signals of which phases are sequentially shifted are output from terminals of the delay elements or the delay circuits.

The gist of the delay circuits according to the invention is the following configurations (13) to (17).

(13) A delay circuit used in the phase shift circuit of (1) to (12), comprising (a) a serial-connection delay circuit group including Q delay circuits having at least two different delay times, (b) a bypass switch group including Q bypass switches connected between both terminals of the respective delay circuits, and (c) an output switch group including Q switches connected between a terminal apart from a signal input side of the respective delay circuits and an output terminal.

(14)

A delay circuit used in the phase shift circuit of (1) to (12), comprising (a) a serial-connection delay circuit group including Y−1 first delay circuits with a delay time of $T \cdot Y^0$, Y−1 second delay circuits with a delay time of $T \cdot Y^1$, ..., and Y−1 P-th delay circuits with a delay time of $T \cdot Y^{P-1}$, (b) a bypass switch group including Y−1 first bypass switches connected between both terminals of the first delay circuits, Y−1 second bypass switches connected between both terminals of the second delay circuits, . . . , and Y−1 P-th bypass switches connected between both terminals of the P-th delay circuits, and (c) an output switch group including Y−1 first output switches connected between a terminal apart from a signal input side of the first delay circuits and a signal output terminal, Y−1 second output switches connected between a terminal apart from a signal input side of the second delay circuits and a signal output terminal, . . . , and Y−1 P-th output switches connected between a terminal apart from a signal input side of the P-th delay circuits and a signal output terminal.

(15)

The delay circuit according to (14), wherein Y=2.

(16)

The delay circuit according to any one of (13) to (15), wherein a short-circuit preventing switch being turned on or off in synchronization with the bypass switches of the delay circuits are connected in series to the delay circuits.

(17)

The delay circuit according to any one of (13) to (16), wherein the delay circuits include an integration circuit manufactured on a semiconductor integrated circuit.

The delay circuits according to (13) to (17) can be used in the phase shift circuit. In this case, the periodic signal output circuit is connected to a signal input terminal. One period of the periodic signal output circuit is equal to the maximum delay time caused by the serial-connection delay circuit group and is greater than the above-mentioned delay time.

In the invention, the "predetermined timing of a processing signal" is typically a "level-transition timing value of the processing signal."

In the invention, the phase shift circuit includes a serial connection or a parallel connection of delay elements or delay circuits or a serial-parallel connection as a combination thereof.

In the invention, the phase shift circuit can output a single signal. In this case, the phase shift controller can control the phase shift circuit to output a signal with a predetermined phase. Any one of the second to M-th pulses can be output from the terminals of the delay elements or the delay circuit. The phase shift circuit can include a line of switches passing an input signal and the phase shift controller can control the ON and OFF of the switches.

In the invention, the phase shift circuit may output plural signals of which phases are shifted. In this case, any one of the second to M-th pulses can be output from the terminals of the delay elements or the delay circuits. The phase shift circuit can include a line of switches passing an input signal. In this case, the phase shift controller can deactivate the delay elements or the delay circuits not used.

Further, in the invention, the counter circuit may perform one operation of converting a serial input into a parallel output and converting a parallel input into a serial output. Specifically, the counter circuit may be a normal counter outputting a count value in parallel bits, a counter outputting a carrier signal or a borrow signal at the time of counting up or down, or a shift register.

In addition, a tri-state buffer may be used as the delay element and an integration circuit may be used as the delay circuit. An element or circuit capable of converting a voltage into a time may be used as the delay element or the delay circuit.

ADVANTAGES OF THE INVENTION

According to the invention, a predetermined timing (such as period, ON time, OFF time, duty ratio, dead time, and ratio of dead time to period) of a processing signal can be adjusted more finely than that of the frequency of the repeat signal generating circuit. That is, according to the invention, even when an oscillator with a pulse of several tens MHz, it is possible to generate a level-transition timing signal of the processing signal with a frequency of several GHz and thus to provide a PWM control device and a VCO control device with an inexpensive control device. Since the phase shift controller stopping the operation of the pulse generating circuit not performing a counting operation can be provided, it is possible to further reduce the power consumption. Since the phase shift circuit can include a serial connection or a parallel connection of delay elements or delay circuits or a serial-parallel connection as a combination thereof, it is possible to suppress the manufacturing cost.

BRIEF DESCRIPTION OF THE DRAWINGS

FIGS. 16(A) and 16(B) are diagrams illustrating examples of operating waveforms of the timing generating circuit.

FIG. 31 is a diagram illustrating a relation between a delay time of a signal output from the timing generating circuit and an ON/OFF state of a switch group of the phase shift circuit.

FIG. 36 is a diagram illustrating a specific example of a delay circuit shown in FIGS. 36(A) to (D).

FIG. 37 is a diagram illustrating the related art, (A) is a circuit diagram of an integration circuit, (B) is a waveform diagram illustrating an operation where a capacitor is charged in advance, and (C) is an enlarged diagram illustrating a part of the waveform shown in (B).

FIG. 38(A) is a diagram illustrating a circuit for increasing a frequency by interpolating and expanding the number of bits, and (B) is a diagram illustrating an operation of the circuit shown in (A).

DESCRIPTION OF REFERENCE NUMERALS AND SIGNS

1: TIMING GENERATING CIRCUIT
3: DELAY CIRCUIT
11: PERIODIC SIGNAL GENERATING CIRCUIT
12, 121, 122, 52, 62: PHASE SHIFT CIRCUIT
13, 54, 64: PHASE SHIFT CONTROLLER
14, 141, 142, 14(1), 14(2), ..., 14(M), 64: COUNTING CIRCUIT
15, 151, 152: SELECTION CIRCUIT
16: SELECTION CONTROLLER
19: WAVEFORM SHAPING CIRCUIT
31: CIRCUIT ELEMENT GROUP
32: DELAY CONTROLLER
53: OSCILLATION CIRCUIT
111: OSCILLATION CIRCUIT GROUP
112: PHASE SHIFT CIRCUIT
113: SHIFT CONTROLLER
$dly_k$: DELAY CIRCUIT (k=1, 2, ..., AND Q)
ES: EXTERNAL SIGNAL
$N_1$: UPPER CIPHER
$N_2$: LOWER CIPHER
PLS: REPEAT SIGNAL
$PLS_{PS}$:
$Phase_k$: PHASE SHIFT SIGNAL (k=1, 2, ..., AND M)
$PG_k$: k-th OSCILLATION CIRCUIT (k=1, 2, ..., AND M)
$PLS_k$: k-th PULSE (k=1, 2, ..., AND M)
$S_{Ak}$: BYPASS SWITCH GROUP (k=1, 2, ..., AND Q)
$S_{Bk}$: OUTPUT SWITCH (k=1, 2, ..., AND Q)
$S_{Ck}$: SHORT-CIRCUIT PREVENTING SWITCH (k=1, 2, ..., AND Q)
SW: SWITCH
TS, $TS_1$, $TS_2$: TIMING SIGNAL

BEST MODE FOR CARRYING OUT THE INVENTION

Figure 1:
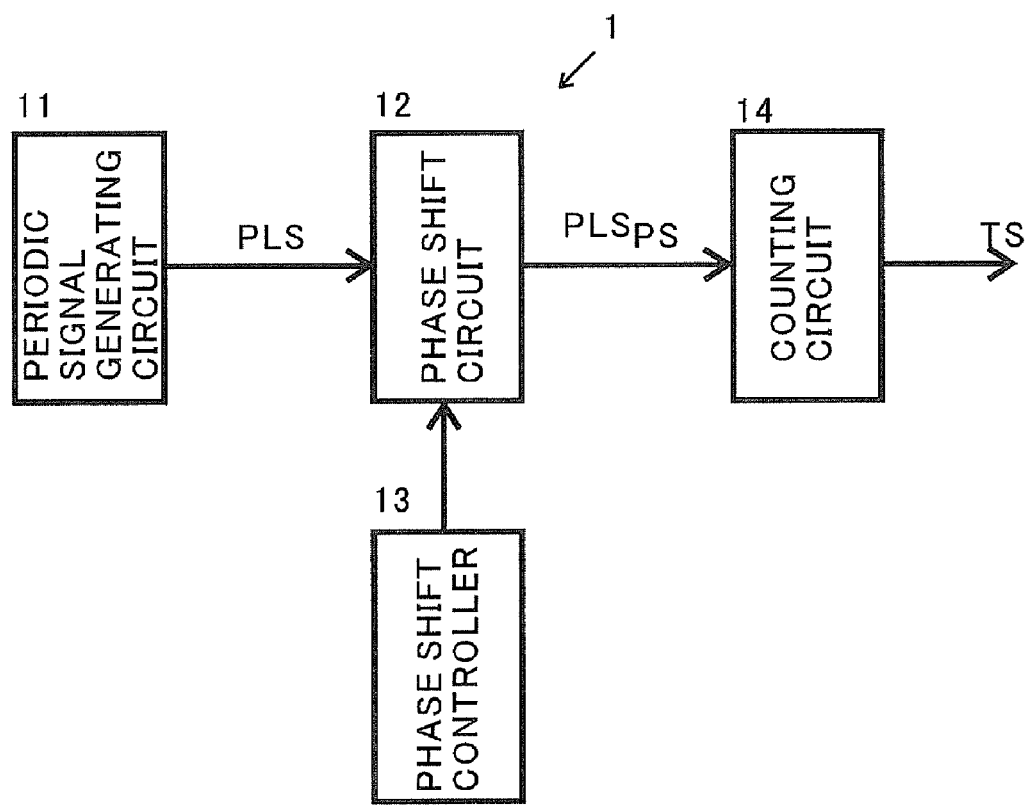
FIG. 1 is a diagram illustrating a timing generating circuit in which a repeat signal generating circuit generates signals with plural phases.
Figure 2:
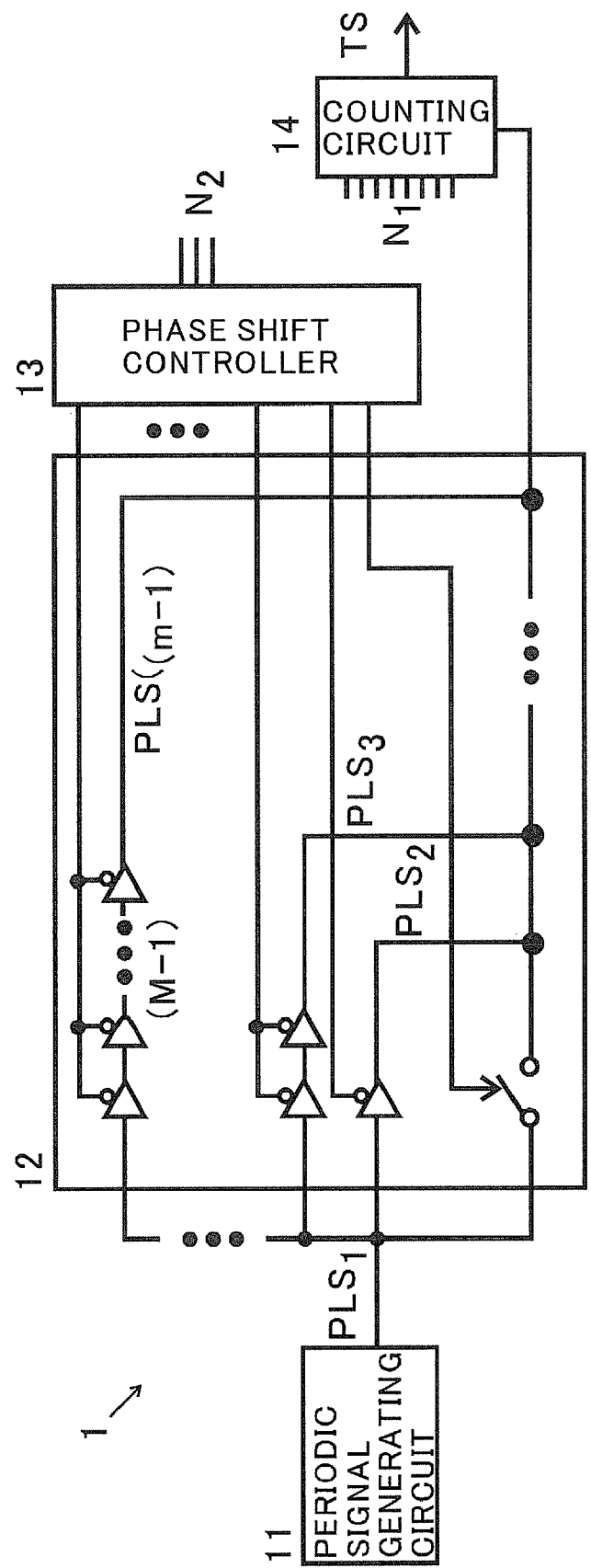
FIG. 2 is a circuit diagram specifically illustrating the timing generating circuit shown in FIG. 1.

FIGS. 1 and 2 are diagrams illustrating the timing generating circuit in which the repeat signal generating circuit generates signals with plural phases.

In FIG. 1, the timing generating circuit 1 generates a predetermined timing (such as period, ON time, OFF time, duty ratio, dead time, and ratio of dead time to period) of a processing signal and includes a repeat signal generating circuit 11, a phase shift circuit 12, a phase shift controller 13, and a counter circuit 14.

The phase shift circuit 12 receives a repeat signal PLS from the repeat signal generating circuit 11 and outputs a pulse of which a phase is shifted by a predetermined quantity. The phase shift controller 13 controls what phase of pulse the phase shift circuit 12 should output.

The counter circuit 14 counts the output of the phase shift circuit 12 up to a predetermined value (the number corresponding to the value of the upper cipher $N_1$) and outputs a count end signal (signal output after the counting up or down is ended). This signal is a synthesized timing signal of the timing (timing corresponding to the value of the upper cipher $N_1$) and the timing (timing corresponding to the value of the lower cipher $N_2$ and being selected by the phase shift controller 13) shifted by the phase shift circuit 12.

FIG. 2 is a circuit diagram specifically illustrating the timing generating circuit 1 shown in FIG. 1. The phase shift circuit 12 includes a parallel connection of a switch SW, a first delay circuit generating a delay time T, a second delay circuit generating a delay time 2T, ..., and a (M−1)-th delay circuit generating a delay time (M−1)T.

As shown in FIG. 2, the phase shift circuit 12 uses the pulse PLS output from the repeat signal generating circuit 11 as a first pulse $PLS_1$ to output the first pulse $PLS_1$ or one of a second pulse $PLS_2$, a third pulse $PLS_3$, ..., and an M-th pulse $PLS_M$ of which the phases are sequentially shifted from the first pulse $PLS_1$ as $PLS_{PS}$. Here, the phase shift controller 13 controls the phase shift circuit 12 to output only one pulse of the first to M-th pulses $PLS_1$ to $PLS_M$.

The switch SW selects the signal from the repeat signal generating circuit 11 as $PLS_1$, the first delay circuit generates $PLS_2$ obtained by delaying $PLS_1$ by T, and the second delay circuit generates $PLS_3$ obtained by delaying $PLS_1$ by 2T. The (M−1)-th delay circuit generates $PLS_M$ obtained by delaying $PLS_1$ by (M−1)T. The phase shift controller 13 has a lower cipher of the timing value set therein, activates the switch SW and one of the first to (M−1)-th delay circuits, and deactivates the other delay circuits. The counter circuit 14 has an upper cipher $N_1$ and the counter circuit 14 can output a timing signal TS corresponding to the timing value $N_1N_2$.

Figure 3:
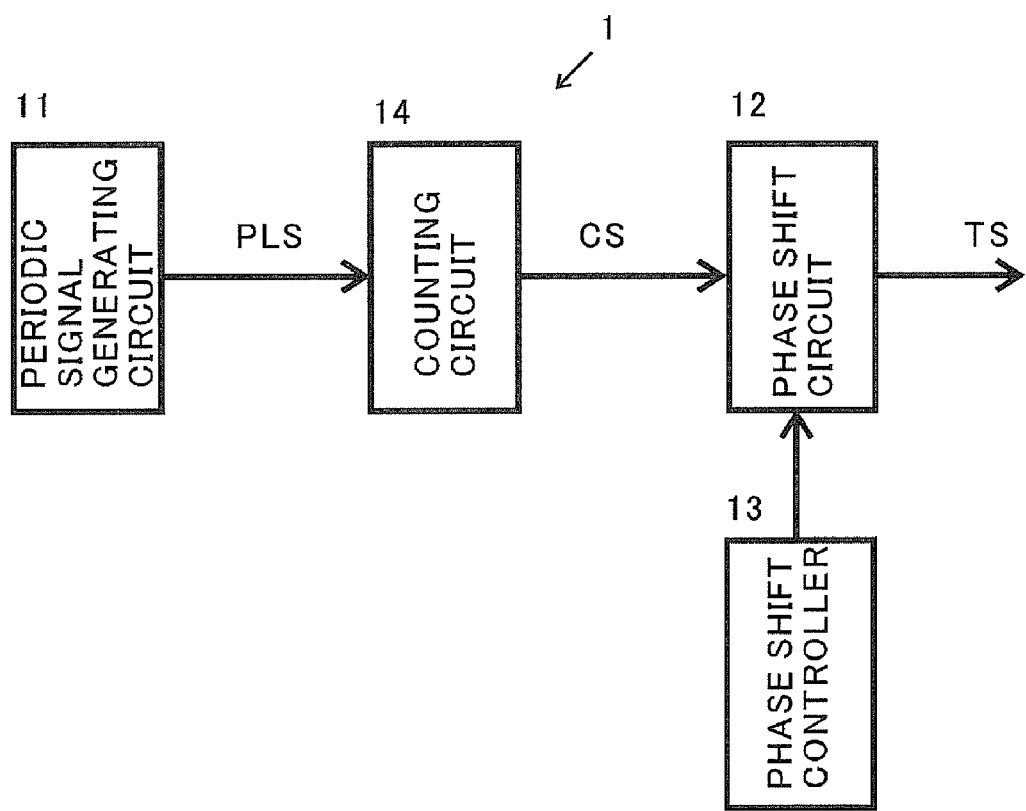
FIG. 3 is a diagram illustrating another example of the timing generating circuit according to the invention.

FIG. 3 is a diagram illustrating another configuration of the timing generating circuit according to the invention. In FIG. 3, the timing generating circuit 1 generates a predetermined timing (such as period, ON time, OFF time, duty ratio, dead time, and ratio of dead time to period) of a processing signal, similarly to the timing generating circuit shown in FIG. 1 and includes a repeat signal generating circuit 11, a counter circuit 14, a phase shift circuit 12, and a phase shift controller 13.

In FIG. 3, the counter circuit 14 counts the pulses PLS from the repeat signal generating circuit 11 up to a predetermined number (value of the upper cipher $N_1$) and then outputs a count end signal. The phase shift circuit 12 outputs one of pulses PLS of which phases are shifted by a predetermined quantity, when receiving the output pulse (counting end pulse) CS of the counter circuit 14.

The phase shift controller 13 controls what phase of pulse the phase shift circuit 12 should output. Accordingly, the phase shift circuit 12 can output a synthesized timing pulse of the timing (timing corresponding to the value of the upper cipher $N_1$) of the repeat signal and the timing (timing corresponding to the value of the lower cipher $N_2$ and being selected by the phase shift controller 13) shifted by a predetermined quantity by the phase shift circuit 12.

Figure 4:
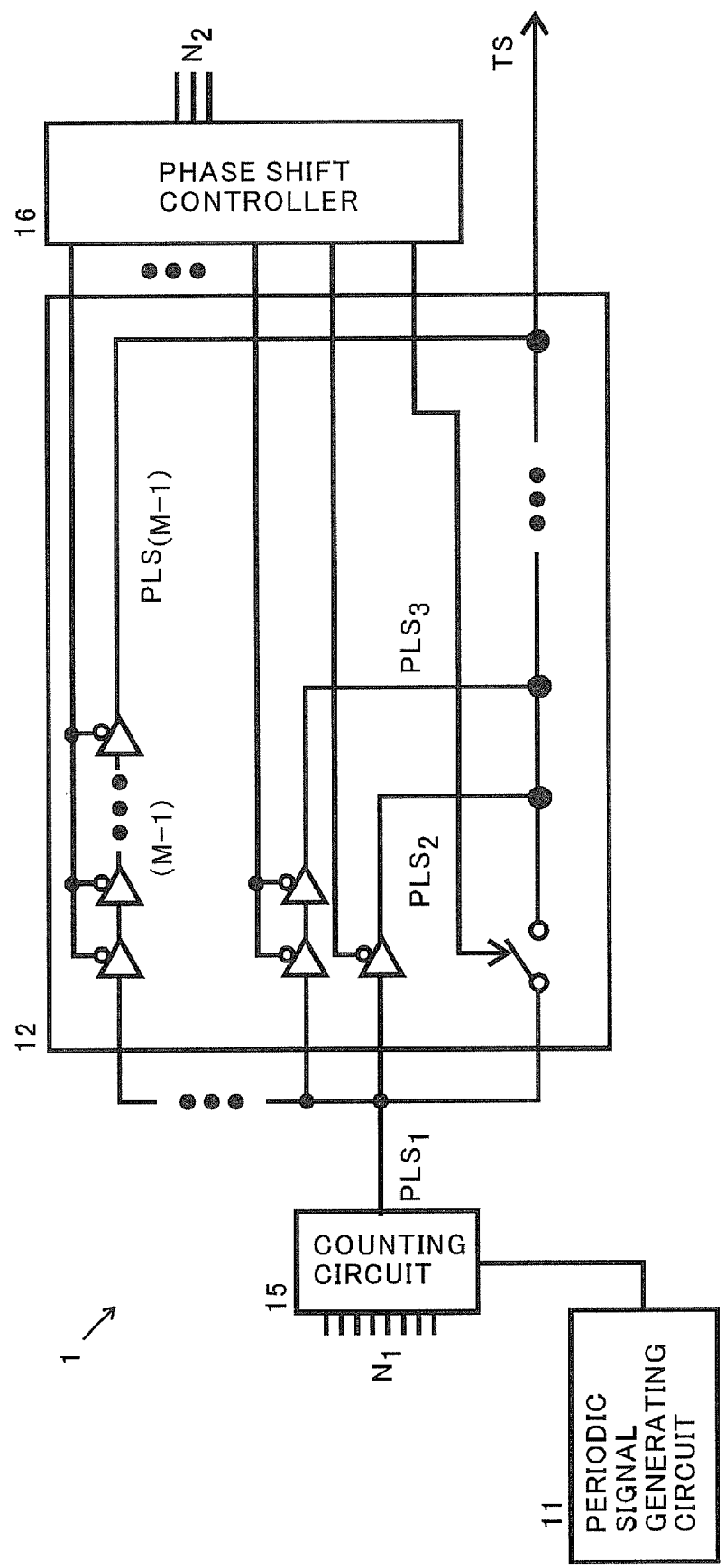
FIG. 4 is a circuit diagram illustrating a specific example of the timing generating circuit shown in FIG. 3.

As shown in FIG. 4, the phase shift circuit 12 uses the count end signal output from the counter circuit 14 as a first pulse $PLS_1$ to output the first pulse $PLS_1$ or one of a second pulse $PLS_2$, a third pulse $PLS_3$, . . . , and an M-th pulse $PLS_M$ of which the phases are sequentially shifted from the first pulse $PLS_1$. The phase shift controller 13 controls the phase shift circuit 12 to output one of the first to M-th pulses $PLS_1$ to $PLS_M$.

In the timing generating circuit 1 shown in FIG. 2, the counter circuit 14 is disposed at a back stage of the phase shift circuit 12, but the counter circuit 14 is disposed at a back stage of the phase shift circuit 12 in FIG. 4. Similarly to FIG. 2, in FIG. 4, the lower cipher $N_2$ of the timing signal is set in the phase shift controller 13, the upper cipher $N_1$ is set in the counter circuit 14, and the phase shift circuit 12 can output a timing signal TS corresponding to the timing value $N_1N_2$.

In the timing generating circuits shown in FIGS. 1 and 3, the constituent elements may be properly shared or the timing generating circuits may be combined. Examples thereof are shown in FIGS. 5 to 8.

Figure 5:
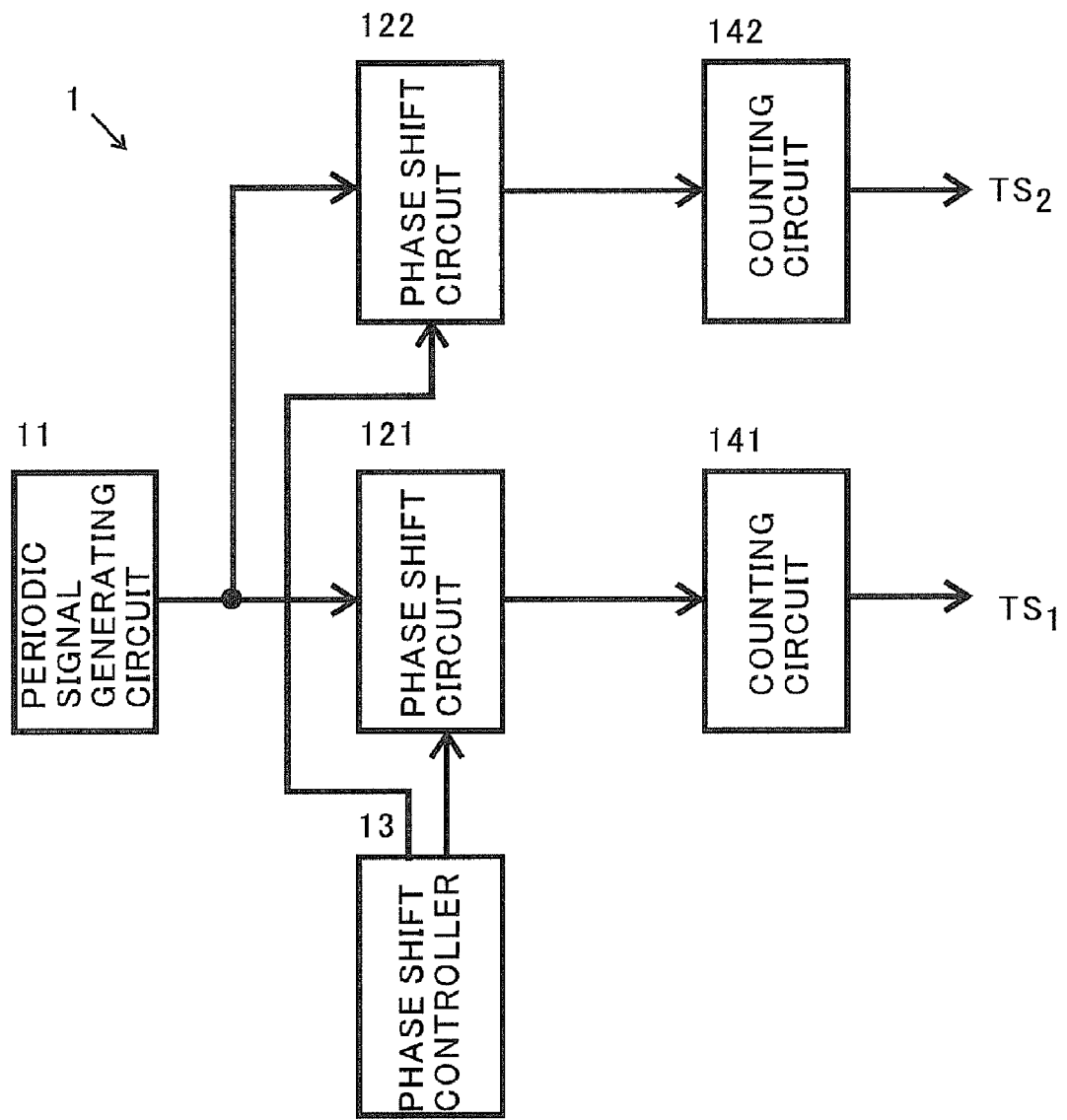
FIG. 5 is a diagram illustrating a modified example of the circuit shown in FIG. 1.

FIG. 5 is a diagram illustrating a modified example of the circuit shown in FIG. 1. In the timing generating circuit 1 shown in FIG. 5, a phase shift circuit 121 in a group of the phase shift circuit 121 and the counter circuit 141 and a phase shift circuit 122 in a group of the phase shift circuit 122 and the counter circuit 142 are controlled by a single phase shift controller 13. In FIG. 5, the repeat signal generating circuit 11 is also shared by two groups, a timing signal $TS_1$ is output from the counter circuit 141, and a timing signal $TS_2$ is output from the phase shift circuit 122.

Figure 6:
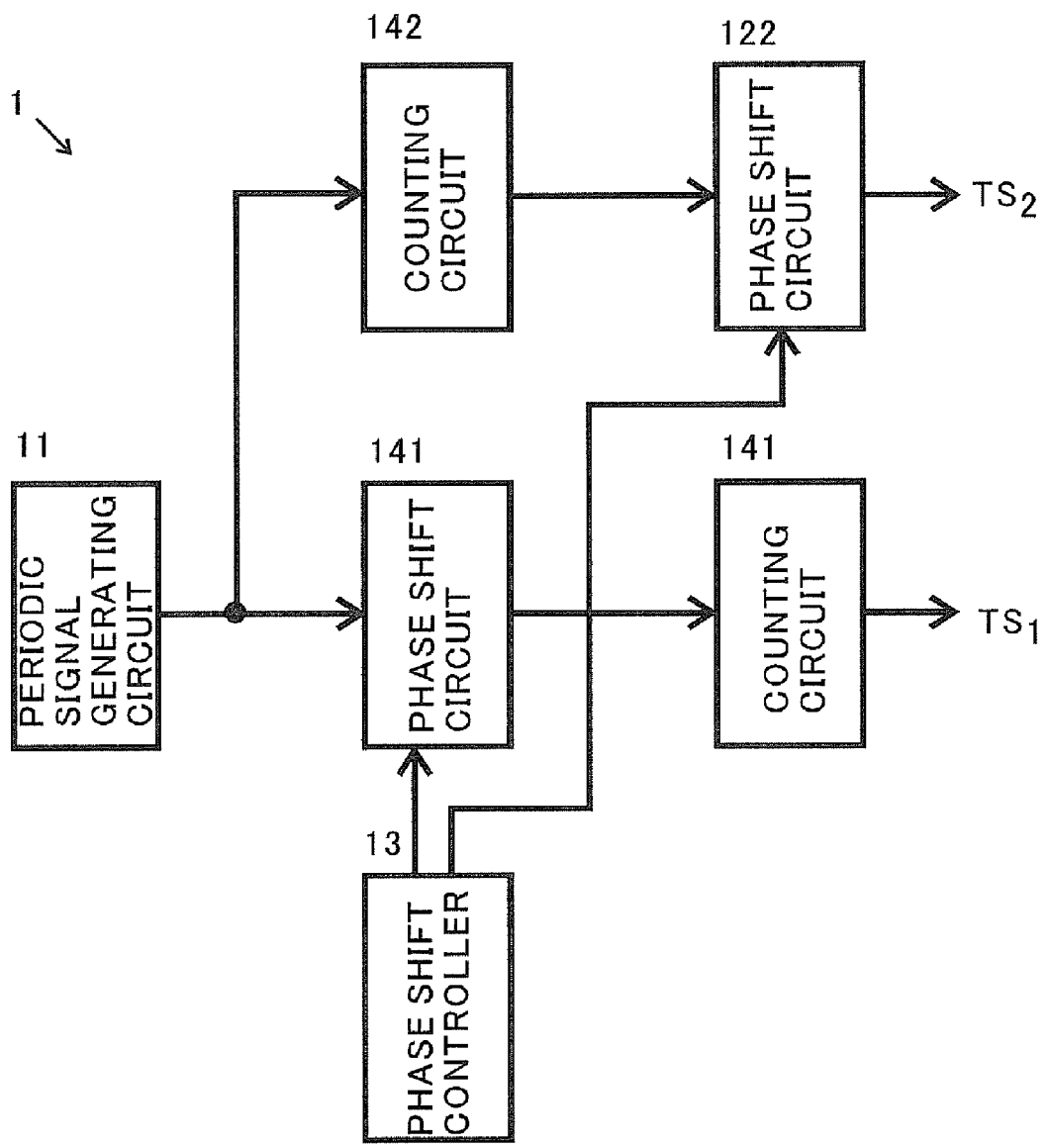
FIG. 6 is a diagram illustrating a combined circuit of the circuit shown in FIG. 1 and the circuit shown in FIG. 3.

FIG. 6 is a diagram illustrating a synthesized circuit of the circuit shown in FIG. 1 and the circuit shown in FIG. 3. In the timing generating circuit 1 shown in FIG. 6, a phase shift circuit 121 in a group of the phase shift circuit 121 and the counter circuit 141 and a phase shift circuit 122 in a group of the phase shift circuit 122 and the counter circuit 142 are controlled by a single phase shift controller 13. In FIG. 3, the repeat signal generating circuit 11 is also shared by two groups, a timing signal $TS_1$ is output from the counter circuit 141, and a timing signal $TS_2$ is output from the phase shift circuit 122.

Figure 7:
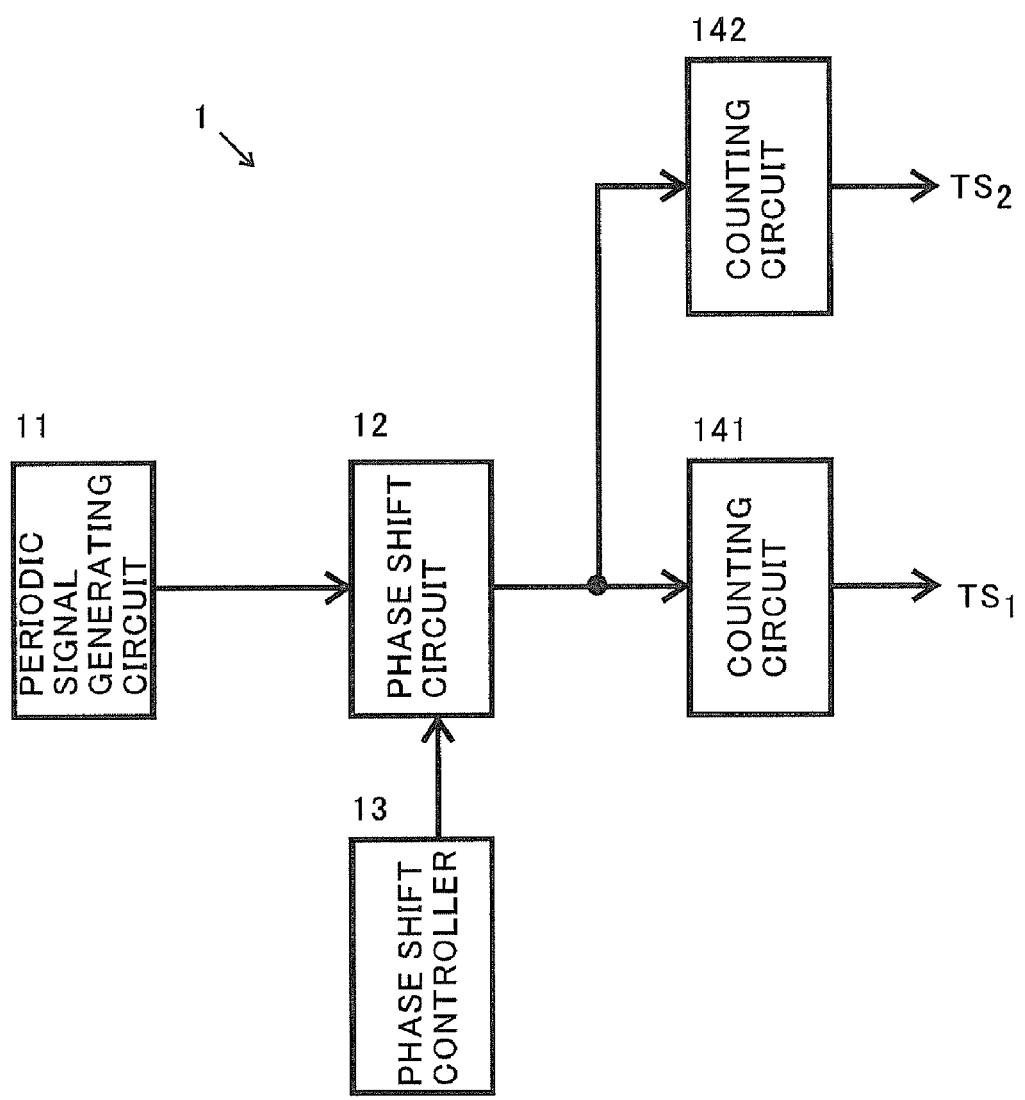
FIG. 7 is a diagram illustrating another modified example of the circuit shown in FIGS. 1 and 2.

FIG. 7 is a diagram illustrating another modified example of the circuits shown in FIGS. 1 and 2. In the timing generating circuit 1 shown in FIG. 7, the counter circuits 141 and 142 are disposed at a back stage of the phase shift circuit 12, a timing signal $TS_1$ is output from the counter circuit 141, and a timing signal $TS_2$ is output from the counter circuit 142.

Figure 8:
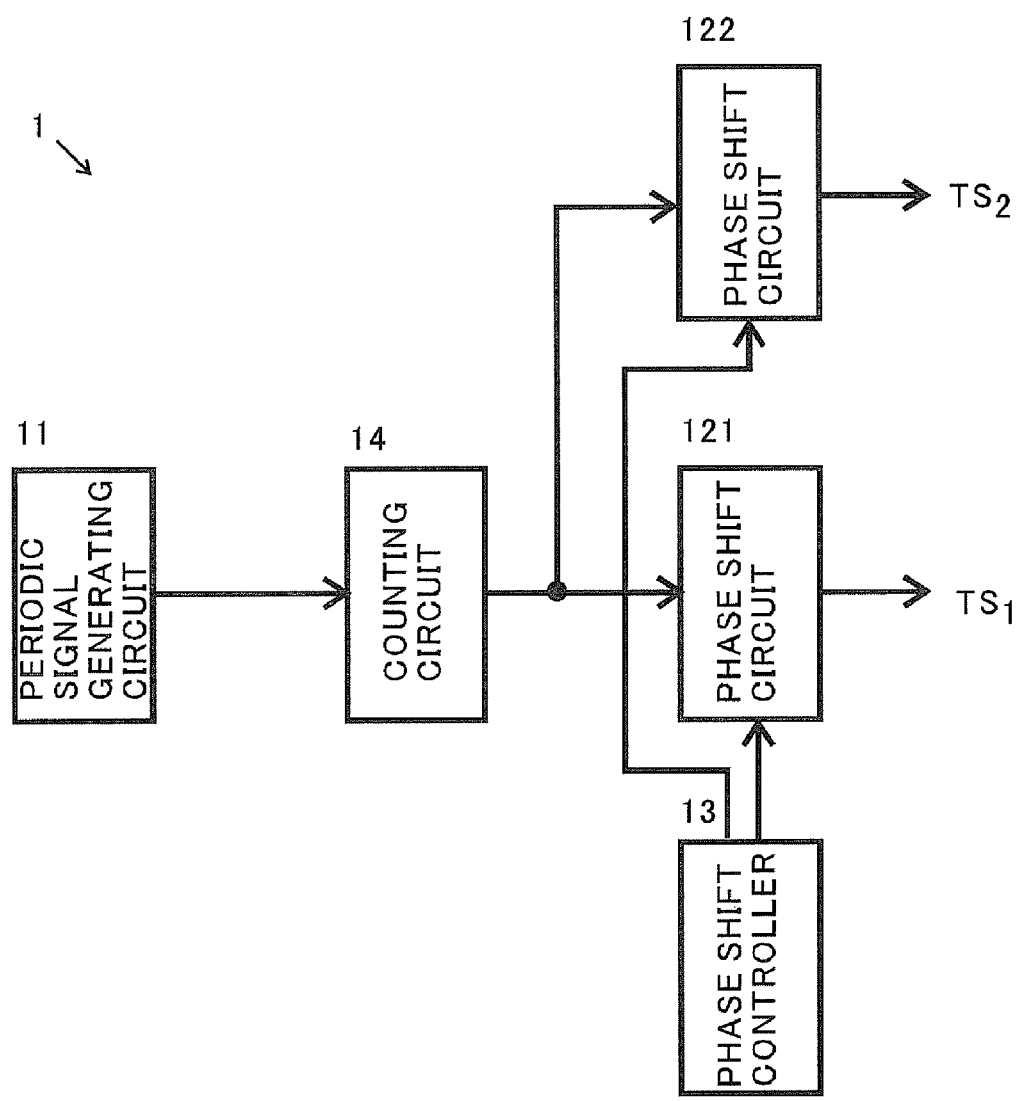
FIG. 8 is a diagram illustrating a modified example of the circuit shown in FIG. 3.

FIG. 8 is a diagram illustrating a modified example of the circuit shown in FIG. 3. In the timing generating circuit 1 shown in FIG. 8, the phase shift circuits 121 and 122 are disposed at a back stage of the counter circuit 14, the phase shift controller 13 is shared by the phase shift circuits 121 and 122, a timing signal $TS_1$ is output from the phase shift circuit 121, and a timing signal $TS_2$ is output from the phase shift circuit 122.

FIGS. 9 to 14 are diagrams illustrating the timing generating circuit according to the invention in which the repeat signal generating circuit generates plural phases of signals.

Figure 9:
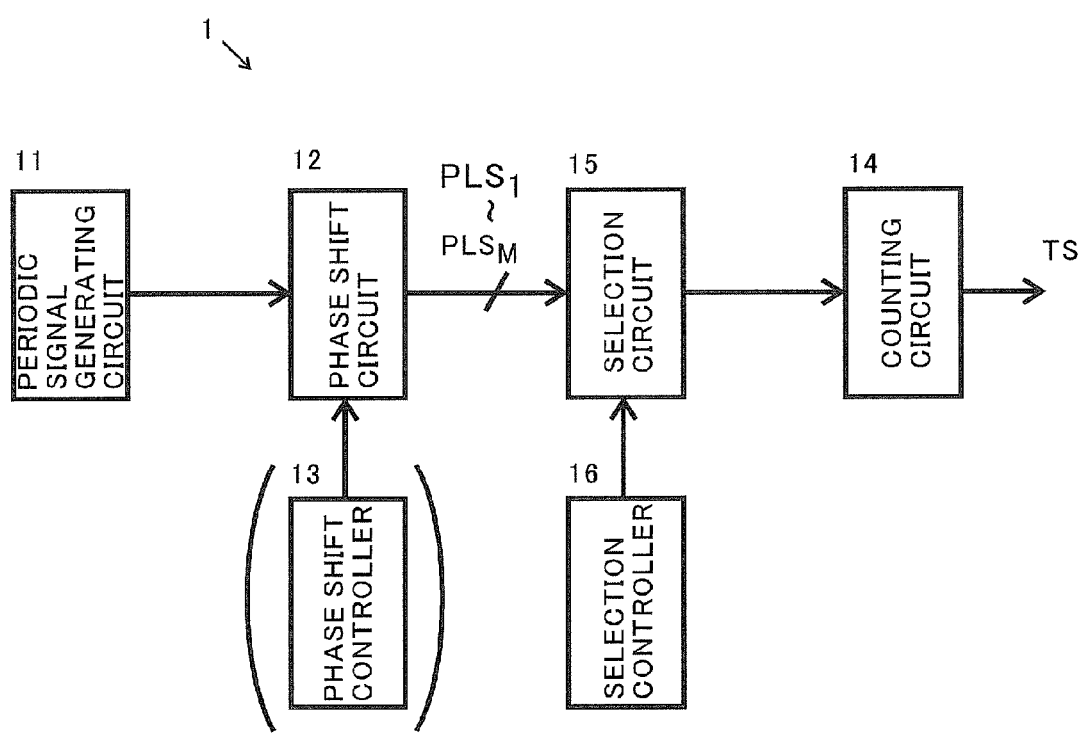
FIG. 9 is a diagram illustrating an example of a timing generating circuit in which a repeat signal generating circuit generates signals with plural different phases.

The timing generating circuit shown in FIG. 9 includes a repeat signal generating circuit 11, a phase shift circuit 12, a phase shift controller 13, a selection circuit 15, a selection controller 16, and a counter circuit 14.

The phase shift circuit 12 uses the pulse output from the repeat signal generating circuit 11 as a first pulse $PLS_1$ to output the first pulse $PLS_1$ or one of a second pulse $PLS_2$, a third pulse $PLS_3$, . . . , and an M-th pulse $PLS_M$ of which the phases are sequentially shifted from the first pulse $PLS_1$. In FIG. 9, the phase shift controller 13 is used to deactivate the elements or circuits not used among the delay elements or the delay circuits of the phase shift circuit 12 and can be omitted.

The selection circuit 15 selects and outputs one of the output signals (the first pulse $PLS_1$ to the M-th pulse $PLS_M$) from the phase shift circuit 12 to correspond to the value of the lower cipher $N_2$ of the timing value.

Figure 10:
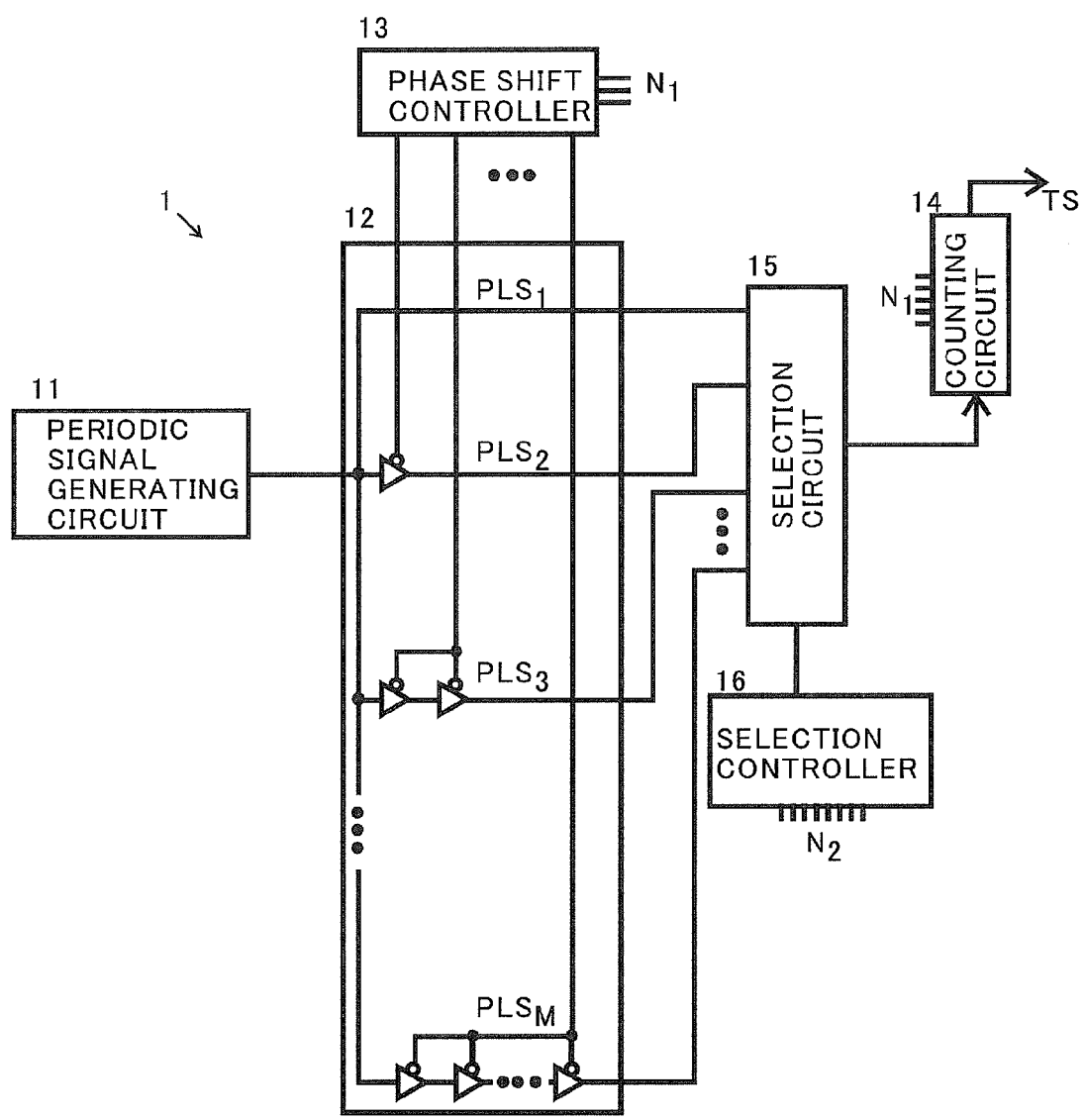
FIG. 10 is a circuit diagram specifically illustrating the timing generating circuit shown in FIG. 9.

That is, as shown in FIG. 10, the selection controller 16 outputs a selection instructing signal to the selection circuit 15 and the selection circuit 15 uses the selection instructing signal as a first pulse $PLS_1$ to output the first pulse $PLS_1$ or one (pulse corresponding to the value of a lower cipher $N_2$ of the timing value) of a second pulse $PLS_2$, a third pulse $PLS_3$, . . . , and an M-th pulse $PLS_M$ of which the phases are sequentially shifted from the first pulse $PLS_1$. Since the value corresponding to the upper cipher $N_1$ of the timing value is set in the counter circuit 14, the counter circuit 14 outputs the count end signal as a timing signal corresponding to a value $N_1N_2$ obtained by combining the value of the lower cipher $N_2$ and the value of the upper cipher $N_1$ when the count value reaches the set value.

In FIG. 10, the phase shift circuit 12 includes a parallel connection of a path passing the signal from the repeat signal generating circuit 11, a first delay circuit generating a delay time T, a second delay circuit generating a delay time 2T, . . . , and a (M−1)-th delay circuit generating a delay time (M−1)T.

The selection circuit 15 receives $PLS_1$, $PLS_2$, $PLS_3$, . . . , and $PLS_M$ and selects one on the basis of the value of the lower cipher $N_2$. The selection circuit 15 makes a selection in accordance with an instruction from the selection controller 16. Since the upper cipher $N_1$ is set in the counter circuit 14, the counter circuit 14 can output a timing signal TS corresponding to the timing value $N_1N_2$.

Figure 11:
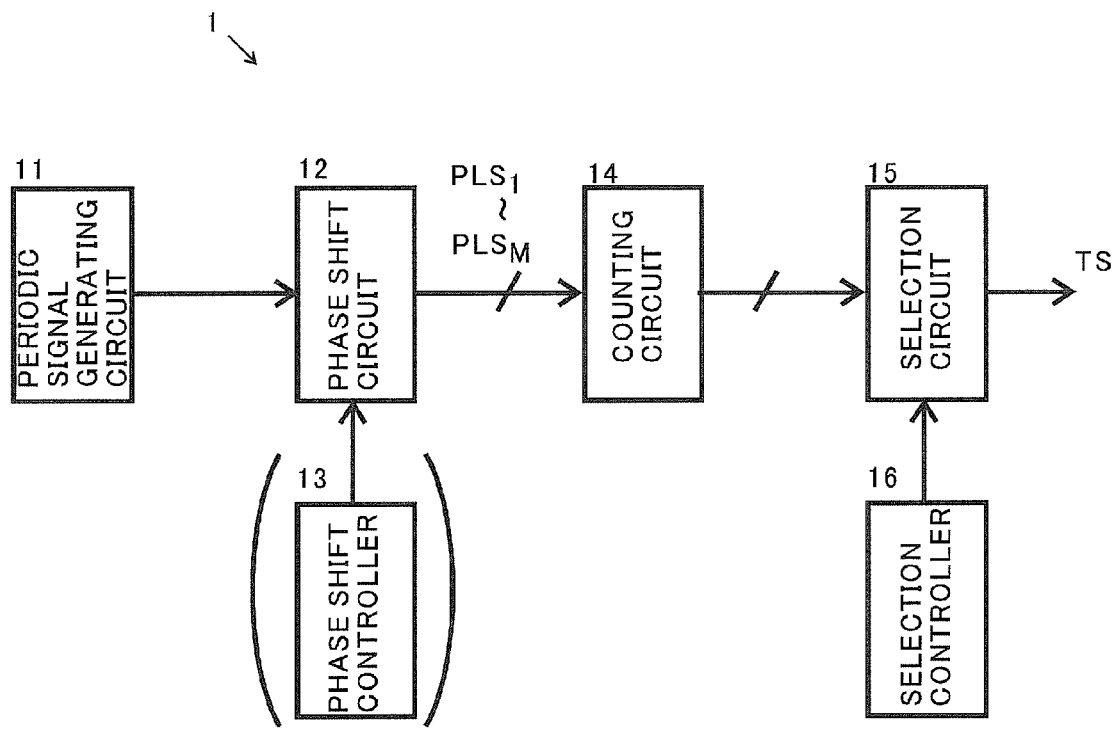
FIG. 11 is a diagram illustrating another example of the timing generating circuit in which the repeat signal generating circuit generates signals with plural different phases.

The timing generating circuit 1 shown in FIG. 11 includes a repeat signal generating circuit 11, a phase shift circuit 12 generating plural signals of which the phases are shifted by a predetermined quantity, a phase shift controller 13, a counter circuit 14 including plural counter circuit elements in which a value $N_1$ corresponding to the upper cipher of the timing signal, a selection circuit 15 selecting the output signals from the plural counter circuit elements on the basis of the value $N_2$ corresponding to the lower cipher of the timing value, and a selection controller 16.

In FIG. 11, the phase shift circuit 12 and the phase shift controller 13 operate similarly to the phase shift circuit 12 and the phase shift controller 13 shown in FIG. 10. That is, he phase shift circuit 12 uses the pulse output from the repeat signal generating circuit 11 as a first pulse $PLS_1$ to output the first pulse $PLS_1$ or one of a second pulse $PLS_2$, a third pulse $PLS_3$, . . . , and an M-th pulse $PLS_M$ of which the phases are sequentially shifted from the first pulse $PLS_1$. In FIG. 11, similarly to FIG. 9, the phase shift controller 13 is used to deactivate the elements or circuits not used among the delay elements or the delay circuits of the phase shift circuit 12 and can be omitted.

The counter circuit elements constituting the counter circuit 14 but not shown receive and count the first pulse $PLS_1$ to the M-th pulse $PLS_M$ which are the output signals of the phase shift circuit 12, and outputs the count end signal when the count value reaches the set value (the value $N_1$ corresponding to the upper cipher of the timing value). The selection circuit 15 selects one of the output signals of the counter circuit elements of the counter circuit 14 on the basis of the value $N_2$ of the lower cipher of the timing value and outputs the selected signal as a timing signal corresponding to the value $N_1N_2$ obtained by combining the value $N_1$ of the upper cipher and the value of the lower cipher $N_2$.

Figure 12:
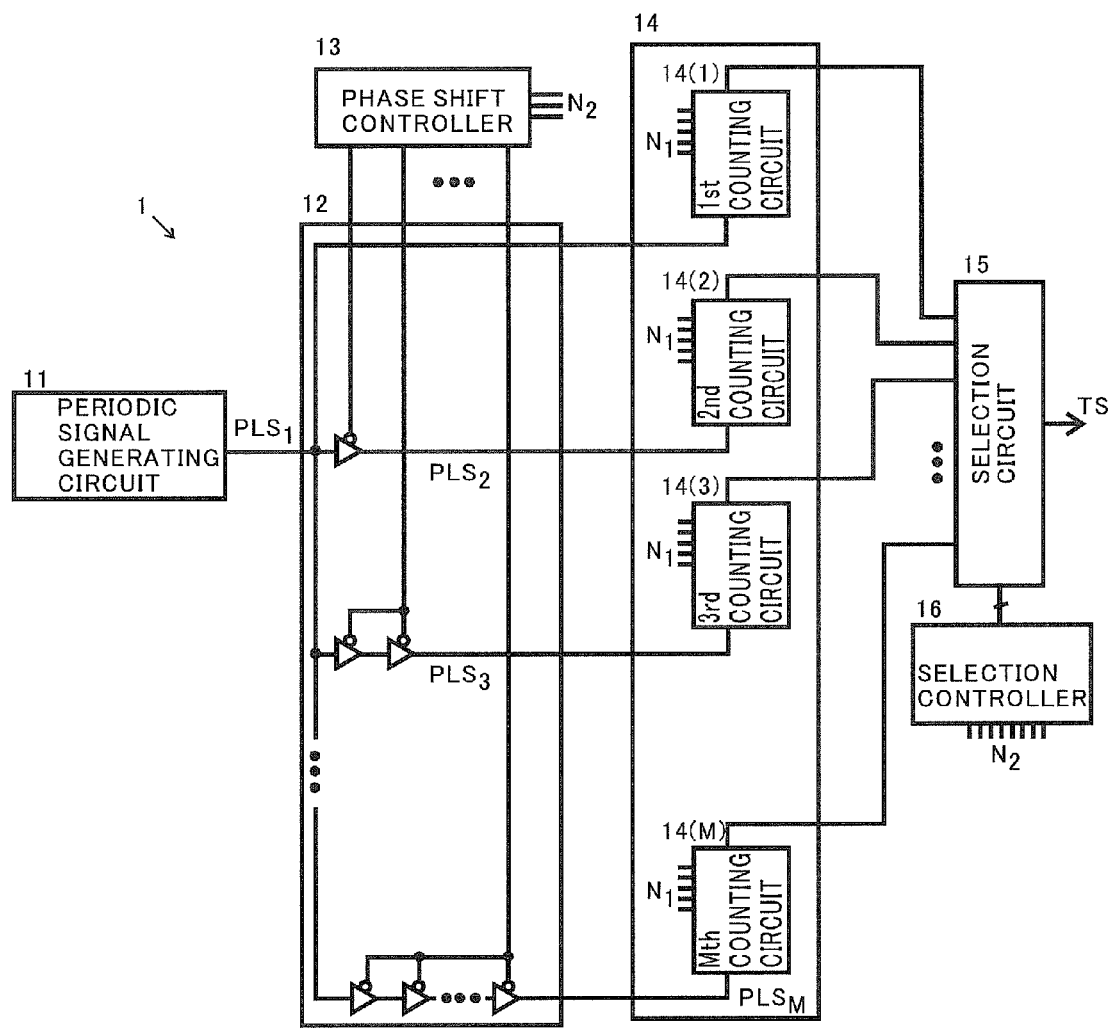
FIG. 12 is a circuit diagram specifically illustrating the timing generating circuit 1 shown in FIG. 11.

FIG. 12 is a circuit diagram specifically illustrating the timing generating circuit 1 shown in FIG. 11. The phase shift circuit 12 includes a parallel connection of a circuit passing the signal from the repeat signal generating circuit 11, a first delay circuit generating a delay time T, a second delay circuit generating a delay time 2T, . . . , and a (M−1)-th delay circuit generating a delay time (M−1)T.

The counter circuit 14 includes counter circuit elements 14(1), 14(2), . . . , and 14(M), which have the value of the upper cipher $N_1$, and outputs the count end signal to the selection circuit 15. The selection circuit 15 receives $PLS_1$, $PLS_2$, $PLS_3$, . . . , and $PLS_M$ and selects $PLS_1$, $PLS_2$, $PLS_3$, . . . , and $PLS_M$ on the basis of the value of the lower cipher $N_2$. The selection circuit 15 can output the timing signal TS corresponding to the timing value $N_1N_2$.

Figure 13:
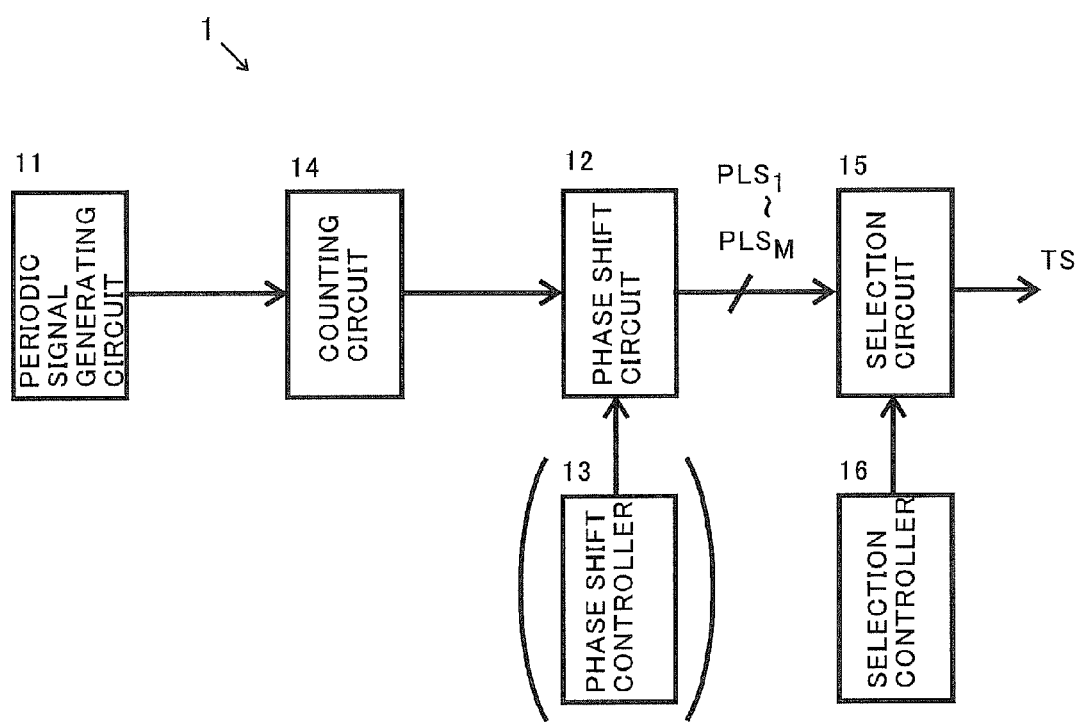
FIG. 13 is a diagram illustrating another example of the timing generating circuit according to the invention in which the repeat signal generating circuit generates signals with plural different phases.

The timing generating circuit 1 shown in FIG. 13 includes a repeat signal generating circuit 11, a counter circuit 14, a phase shift circuit 12, a phase shift controller 13, a selection circuit 15, and a selection controller 16.

The value of the upper cipher $N_1$ of a predetermined timing value is set in the counter circuit 14 by a control device not shown. The counter circuit 14 counts the output pulses of the repeat signal generating circuit 11 until the count value reaches the set value, and outputs the count end signal when the count value reaches the set value (the value $N_1$ corresponding to the upper cipher of the timing value).

The phase shift circuit 12 uses the pulse output from the counter circuit 14 as a first pulse $PLS_1$ to output the first pulse $PLS_1$ or one of a second pulse $PLS_2$, a third pulse $PLS_3$, . . . , and an M-th pulse $PLS_M$ of which the phases are sequentially shifted from the first pulse $PLS_1$. In FIG. 13, similarly to FIGS. 9 and 11, the phase shift controller 13 is used to deactivate the elements or circuits not used among the delay elements or the delay circuits of the phase shift circuit 12 and can be omitted.

The selection circuit 15 selects one of the plural output signals (the first pulse $PLS_1$, the second pulse $PLS_2$, . . . , and the M-th pulse $PLS_M$) of the phase shift circuit on the basis of the value $N_2$ corresponding to the lower cipher and outputs the selected signal as a timing signal corresponding to the value $N_1N_2$ obtained by combining the value $N_1$ of the upper cipher and the value $N_2$ of the lower cipher.

Figure 14:
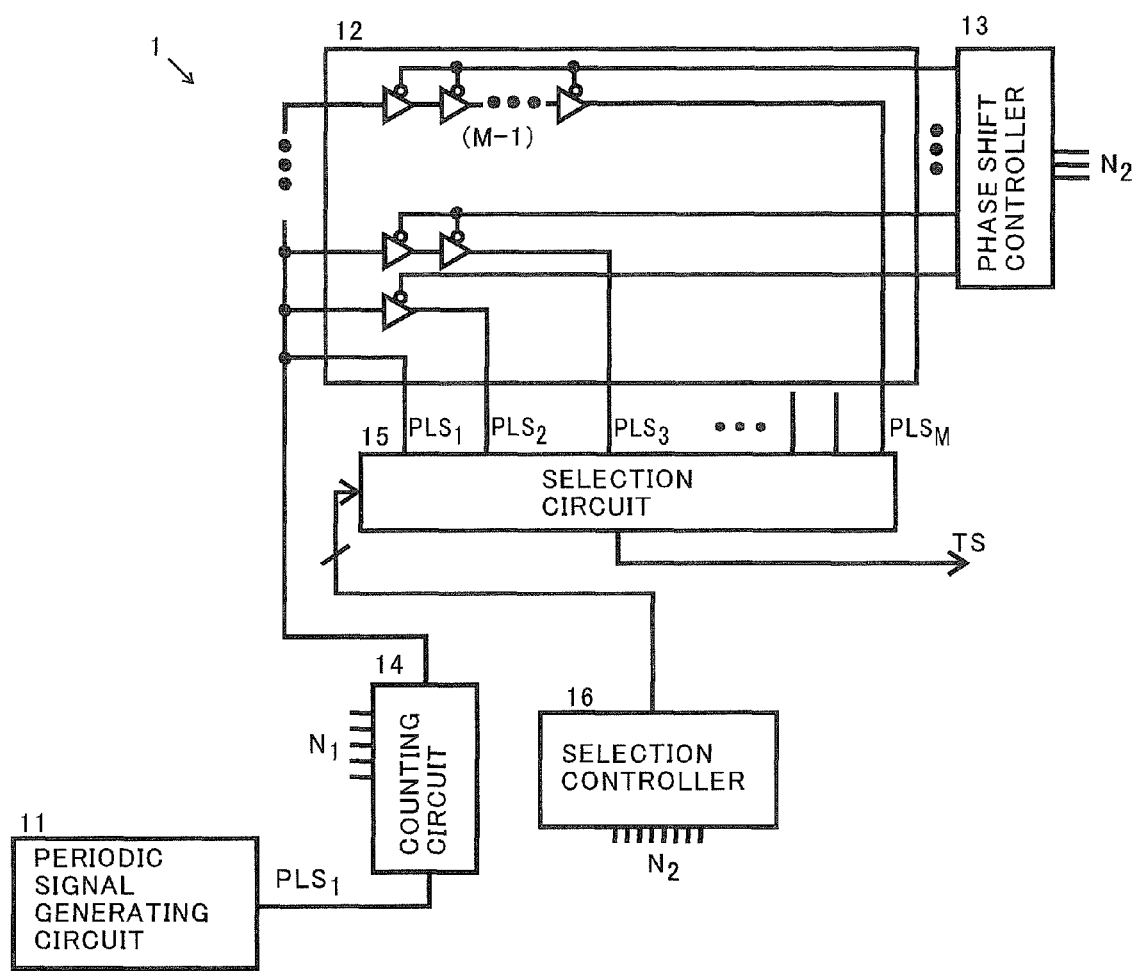
FIG. 14 is a circuit diagram specifically illustrating the timing generating circuit 1 shown in FIG. 13.

FIG. 14 is a circuit diagram specifically illustrating the timing generating circuit 1 shown in FIG. 13.

A value of the upper cipher $N_1$ is set in the counter circuit 14 and the count end signal of the counting circuit 14 is output to the phase shift circuit 12. The phase shift circuit 12 includes a parallel connection of a circuit passing the signal from the repeat signal generating circuit 11, a first delay circuit generating a delay time T, a second delay circuit generating a delay time 2T, . . . , and a (M−1)-th delay circuit generating a delay time (M−1)T and delays the count end signal from the counter circuit 14.

The selection circuit 13 selects one of $PLS_1$, $PLS_2$, $PLS_3$, . . . , and $PLS_M$ on the basis of the value of the lower cipher $N_2$ and outputs the timing signal TS corresponding to the timing value $N_1N_2$.

Figure 15:
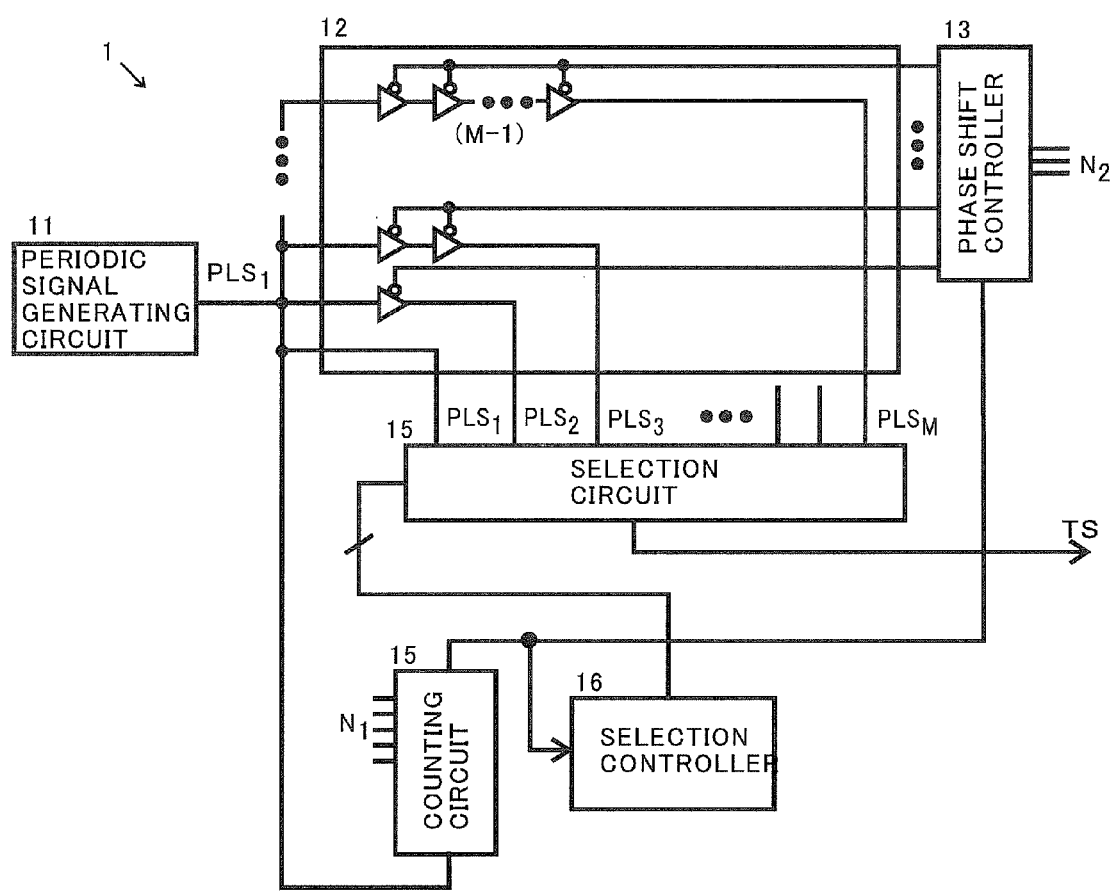
FIG. 15 is a circuit diagram specifically illustrating another example of the timing generating circuit 1 shown in FIG. 13.

FIG. 15 is a diagram illustrating another example of the timing generating circuit 1 specifically illustrated in FIG. 13. In FIG. 15, when the counter circuit 14 outputs the count end signal, the selection controller 16 gives a selection instruction to the selection circuit 15 on the basis of the count end signal. The phase shift controller 13 deactivates the delay circuits not used on the basis of count end signal from the counter circuit 14.

The first pulse $PLS_1$, the second pulse $PLS_2$, the third pulse $PLS_3$, . . . , and the M-th pulse $PLS_M$, and the timing signal TS are shown in FIGS. 16(A) and 16(B). $N_2$ is the maximum $N_{2MAX}$ in FIG. 16(A) and $0<N_2<N_{2MAX}$ is satisfied in FIG. 16(B).

Figure 17:
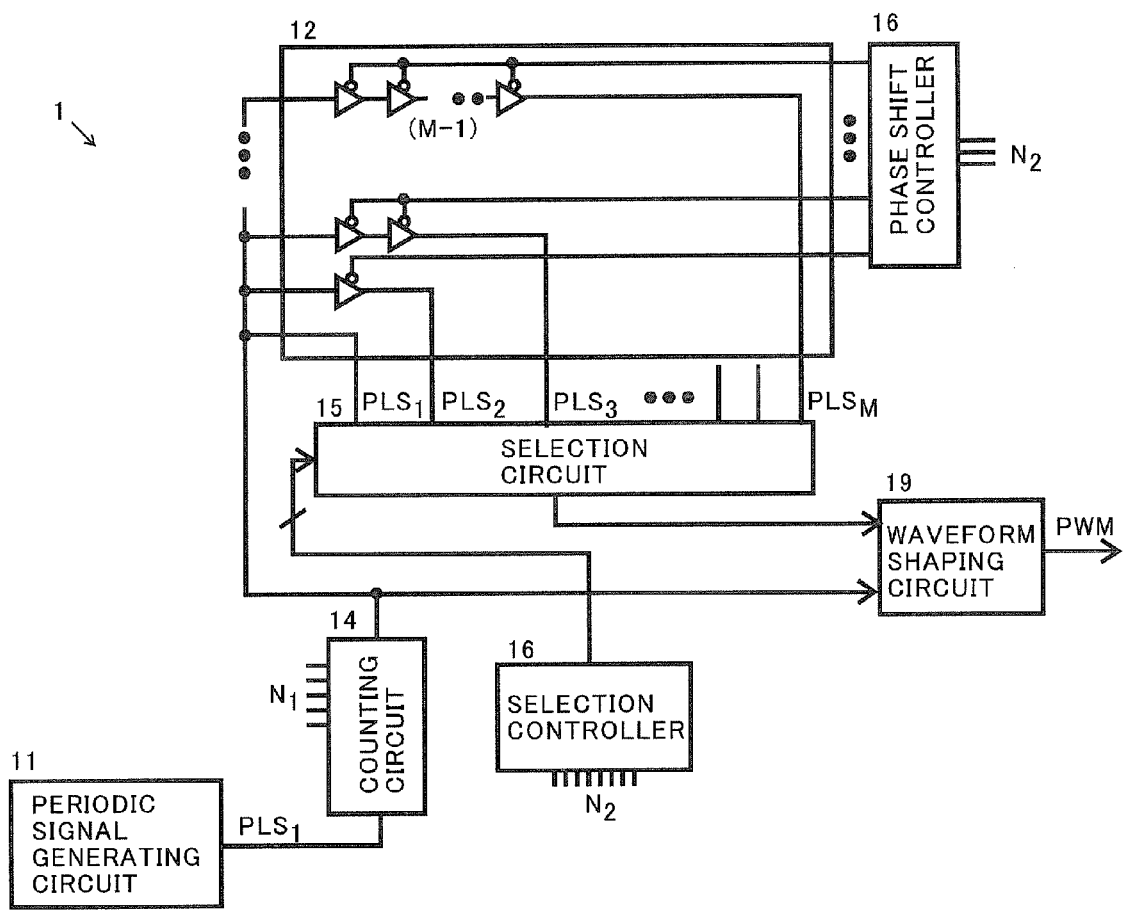
FIG. 17 is a circuit diagram illustrating an example where the timing generating circuit according to the invention is applied to a pulse generating circuit.

FIG. 17 is a circuit diagram illustrating an example where the timing generating circuit according to the invention is applied to a pulse generating circuit.

In FIG. 17, the pulse generating circuit generates a level-transition timing signal of a processing signal which is unchanged or changed in period and which is transited to plural levels in one period. The processing signal may be a pulse signal of which the pulse width is modulated or an output pulse signal of a voltage-controlled oscillator.

The repeat signal generating circuit 11 may employ an oscillation circuit of, for example, 25 to 100 MHz. The counter circuit 14 receives a pulse from the repeat signal generating circuit 11, has set a value corresponding to the upper cipher $N_1$ of the timing value ($N_1N_2$ in this example), and outputs a pulse as a first signal when the count value reaches the value $N_1$.

The phase shift circuit 12 outputs a second pulse $PLS_2$ of which the phase is shifted by the delay time T from the output pulse of the counter circuit 14, a third pulse $PLS_3$ of which the phase is shifted by the delay time 2T from the second pulse, . . . , and an M-th pulse $PLS_M$ of which the phase is shifted by the delay time (M−1)T from the (M−1)-th pulse $PLS_{M-1}$ (where (M−1)T<pulse period $T_P$).

The selection circuit 15 receives the first to M-th pulses of the output of the phase shift circuit 12. The value of the lower cipher $N_2$ of the timing value at which the processing signal is transited in level is set in the selection controller 16. The selection controller 16 outputs the selection instructing signal for selecting one of the first to M-th pulses to the selection circuit 15 on the basis of the set value.

The waveform shaping circuit 19 receives the first pulse $PLS_1$ output from the counter circuit 14 and one of the second to M-th pulses output from the selection circuit 15 and outputs a shaped waveform (synthesized waveform) on the basis of the waveforms of the received pulses. The waveform shaping circuit 19 can process the input pulses, typically includes an AND circuit or an OR circuit, and can adjust the rising or falling timing of the first pulse with the precision integer times as fine as T.

Figure 18:
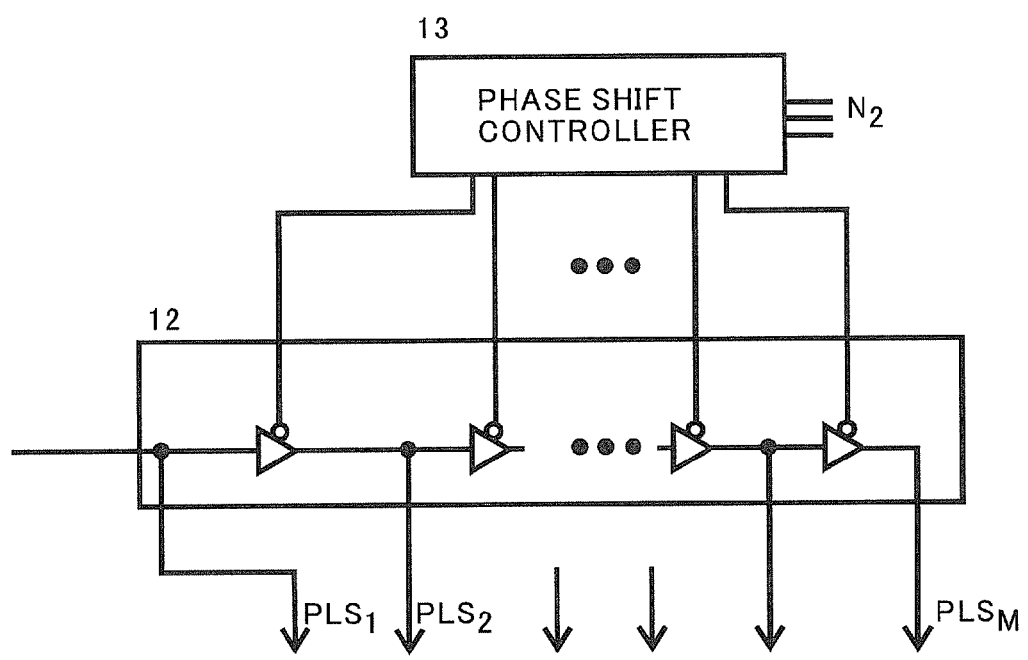
FIG. 18 is a diagram illustrating an example of a phase shift circuit in which delay elements or delay circuits are directly connected.

In the timing generating circuits shown in FIGS. 12, 14, and 15, the delay elements or the delay circuits having different delay times are connected in parallel as the phase shift circuit. However, as shown in FIG. 18, the delay elements or the delay circuits having the same delay time T may be connected in series and the delay signals of the delay times T, 2T, . . . , and (M−1)T may be acquired from the connection terminals.

In the timing generating circuits shown in FIGS. 9 to 15, the constituent elements can be properly used in common or the timing generating circuits can be combined. An example thereof is shown in FIGS. 19 and 20.

Figure 19:
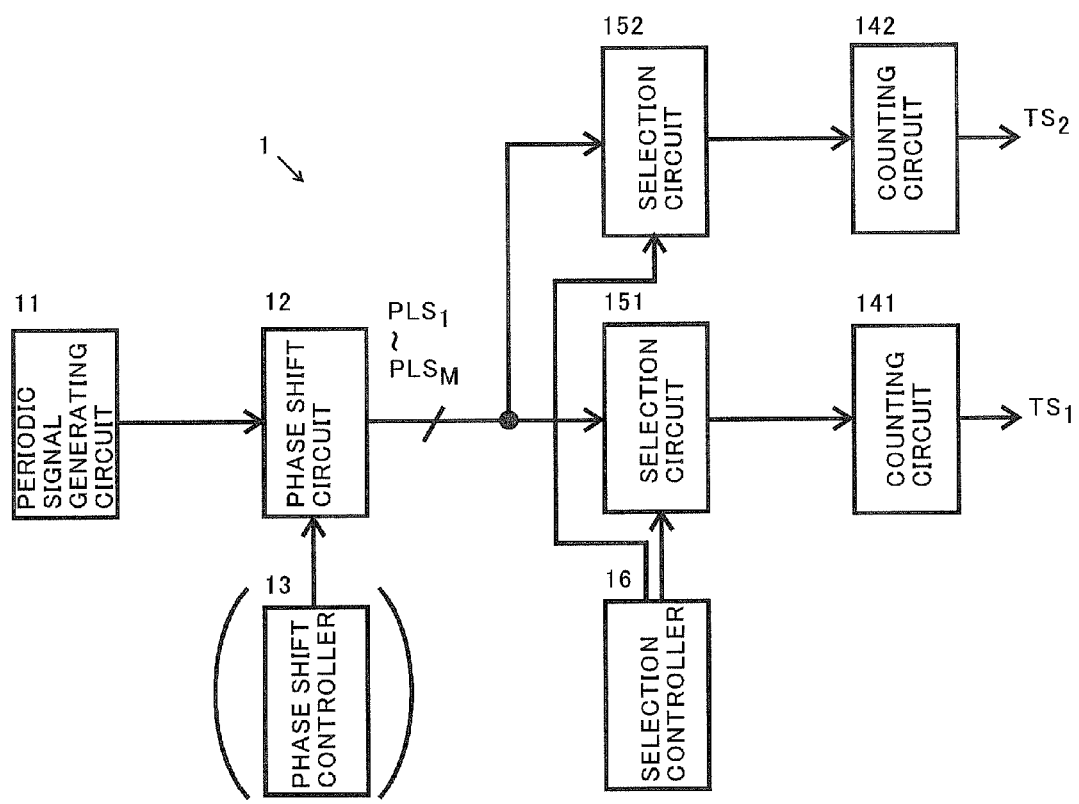
FIG. 19 is a diagram illustrating a modified example of the circuit shown in FIG. 9.

FIG. 19 is a diagram illustrating a modified example of the circuit shown in FIG. 9. In the timing generating circuit 1 shown in FIG. 19, a group of a selection circuit 151 and a counter circuit 141 and a group of a selection circuit 152 and a counter circuit 142 are connected to the back stage of the phase shift circuit 12 (including the phase shift controller 13), and the selection circuit 151 and the selection circuit 152 are controlled by a single selection controller 16. In FIG. 19, the repeat signal generating circuit 11 is shared by two groups, a timing signal $TS_1$ is output from the counter circuit 141, and a timing signal $TS_2$ is output from the counter circuit 142.

Figure 20:
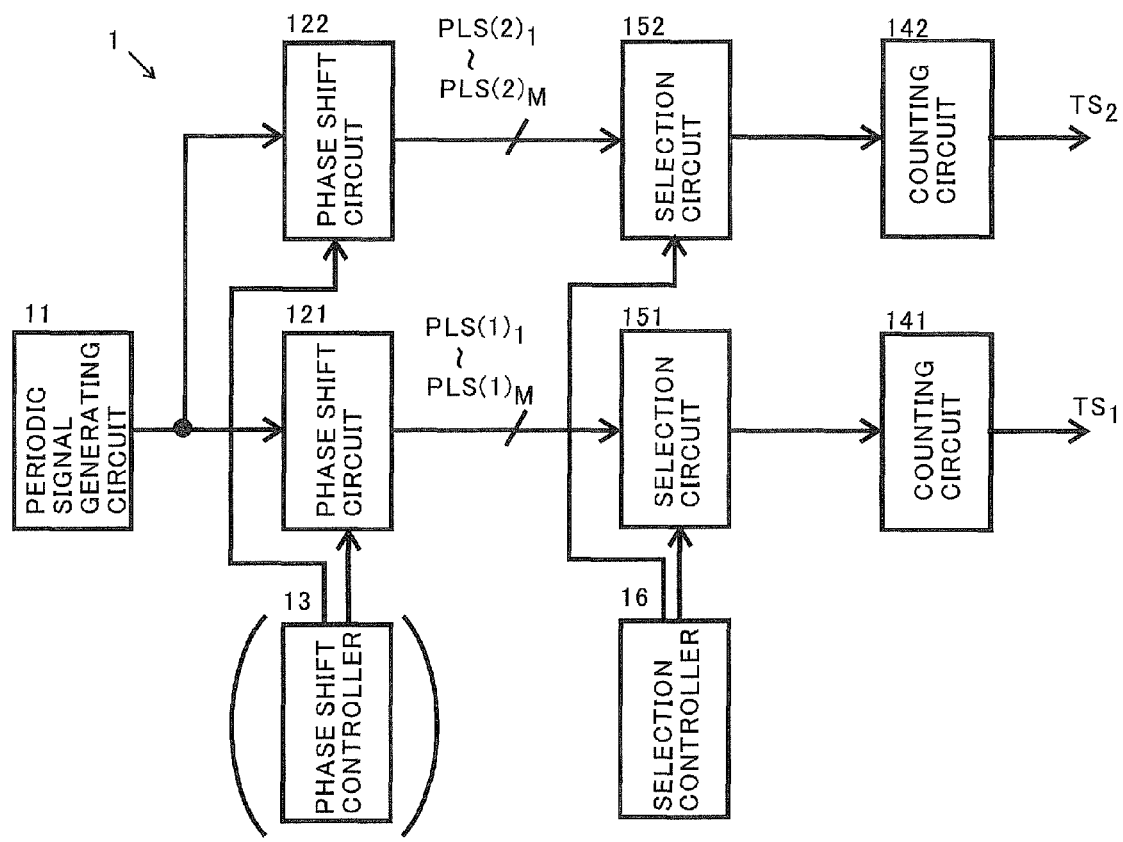
FIG. 20 is a diagram illustrating another modified example of the circuit shown in FIG. 9.

FIG. 20 is a diagram illustrating another modified example of the circuit shown in FIG. 9. In the timing generating circuit 1 shown in FIG. 20, a group of a phase shift circuit 121, a selection circuit 151, and a counter circuit 141 and a group of a phase shift circuit 122, a selection circuit 152, and a counter circuit 142 are connected to the back stage of the repeat signal generating circuit 11, the selection circuit 151 and the selection circuit 152 are controlled by a single selection controller 16, the phase shift circuit 121 and the phase shift circuit 122 are controlled by a single phase shift controller 13.

In FIG. 20, the repeat signal generating circuit 11 is shared by two groups, a timing signal $TS_1$ is output from the counter circuit 141, and a timing signal $TS_2$ is output from the counter circuit 142. In FIG. 20, the outputs of the phase shift circuit 121 are represented by $PLS(1)_1, PLS(1)_2, \ldots,$ and $PLS(1)_M$ and the outputs of the phase shift circuit 122 are presented by $PLS(2)_1, PLS(2)_2, \ldots,$ and $PLS(2)_M$.

Figure 21:
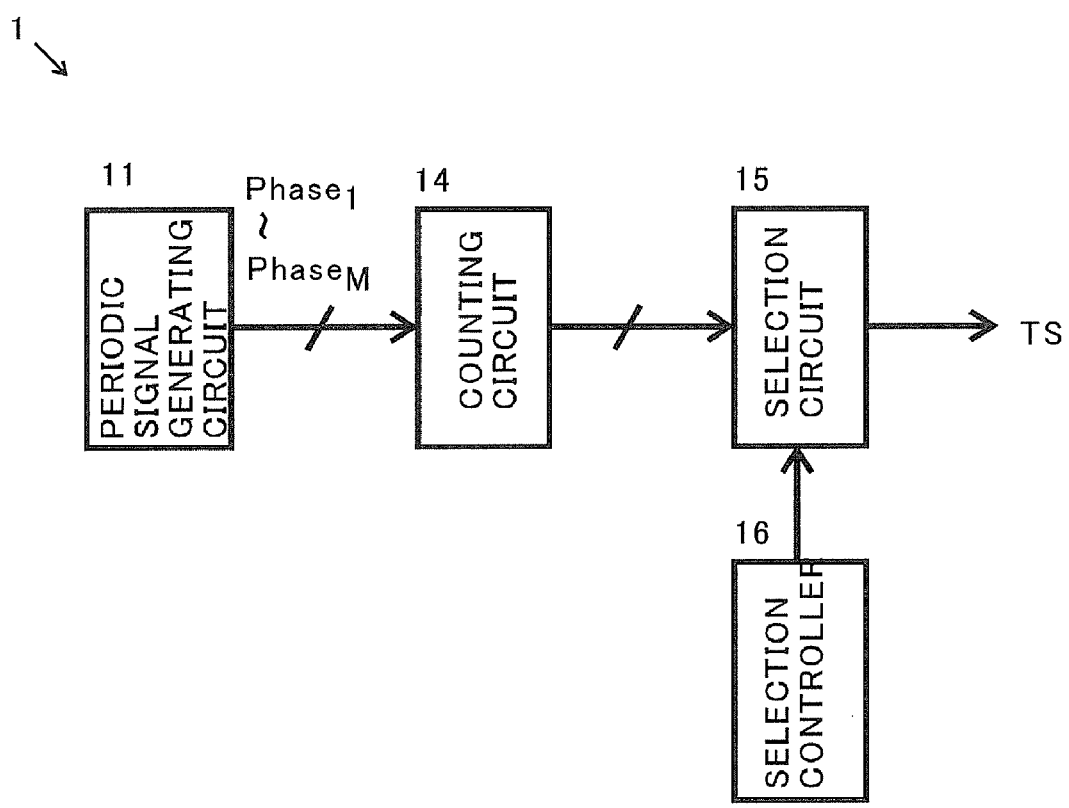
FIG. 21 is a diagram illustrating an example of the timing generating circuit according to the invention in which the repeat signal generating circuit generates signals with plural phases.
Figure 22:
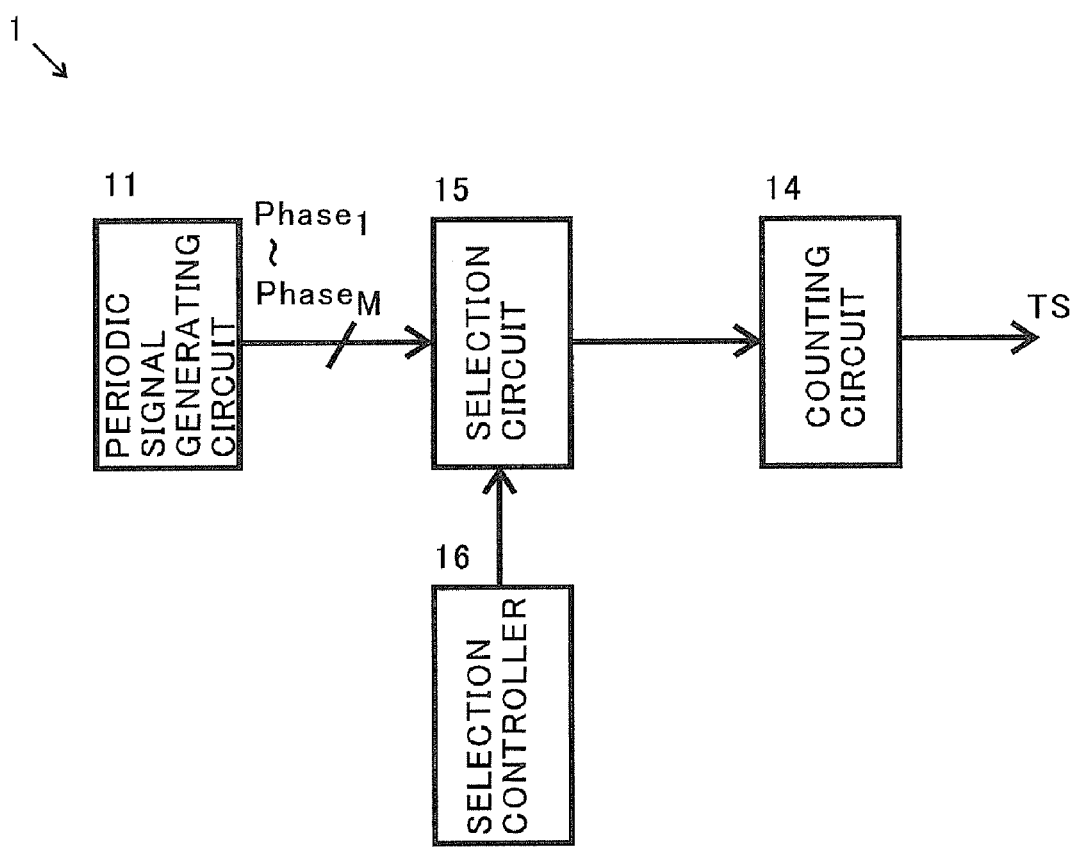
FIG. 22 is a diagram illustrating another example of the timing generating circuit according to the invention in which the repeat signal generating circuit generates signals with plural phases.

FIGS. 21 and 22 are diagrams illustrating a configuration of the timing generating circuit according to the invention in which the repeat signal generating circuit generates plural phases of signals.

The timing generating circuit shown in FIG. 21 includes a repeat signal generating circuit 11, a counter circuit 14, a selection circuit 15, and a selection controller 16. The repeat signal generating circuit 11 outputs plural signals $Phase_1$, $Phase_2, \ldots,$ and $Phase_M$ of which the phases are shifted by a predetermined quantity (including a zero shift quantity). The counter circuit 14 includes plural counter circuit elements set to a value corresponding to the upper cipher $N_1$ of the timing value but not shown. The plural counter circuit elements perform a counting operation until the count value reaches the set value and output the count end signal. The selection circuit 15 selects the count end signals from the plural counter circuit elements on the basis of the value corresponding to the lower cipher $N_2$ and outputs the selected signal as a timing signal TS corresponding to the value $N_1N_2$ obtained by combining the value $N_1$ corresponding to the upper cipher and the value $N_2$ corresponding to the lower cipher. The selection controller 16 outputs a selection instructing signal to the selection circuit 15 to make such a selection.

The timing generating circuit shown in FIG. 22 includes a repeat signal generating circuit 11, a selection circuit 15, a selection controller 16, and a counter circuit 14. The repeat signal generating circuit 11 outputs plural signals of which the phases are shifted by a predetermined quantity (including a zero shift quantity). The selection circuit 15 selects a signal being shifted in phase and being output from the repeat signal generating circuit 11 on the basis of the value of the lower cipher $N_2$ of the timing value.

The counter circuit 14 counts the outputs of the selection circuit 15 and outputs the count end signal as a timing signal TS corresponding to the value $N_1N_2$ obtained by combining the value $N_1$ corresponding to the upper cipher and the value $N_2$ corresponding to the lower cipher when the count value reaches the set value. The selection controller 16 outputs a selection instructing signal to the selection circuit 15 to make such a selection.

Figure 23:
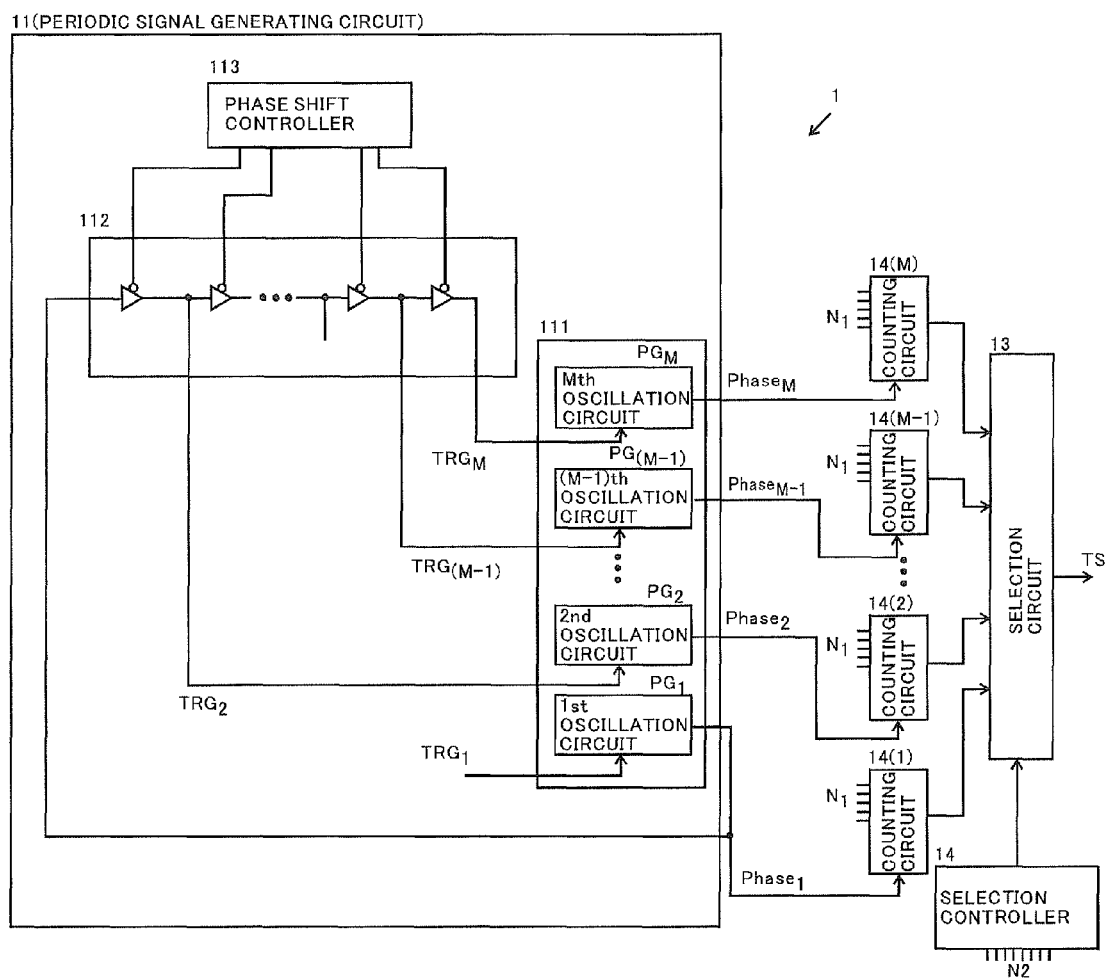
FIG. 23 is a circuit diagram illustrating a specific example of the timing generating circuit shown in FIG. 21.

FIG. 23 is a circuit diagram illustrating a specific example of the timing generating circuit shown in FIG. 21. In FIG. 23, the repeat signal generating circuit 11 includes an oscillation circuit group 111 including a first oscillation circuit $PG_1$ to an M-th oscillation circuit $PG_M$ outputting plural signals $Phase_1$, $Phase_2, \ldots,$ and $Phase_M$, a phase shift circuit 112, and a shift controller 113. In the repeat signal generating circuit 11, when a driving signal $TRG_1$ is input to the first oscillation circuit $PG_1$ and the first oscillation circuit $PG_1$ outputs $Phase_1$, the phase shift circuit 112 outputs the driving signals $TRG_2, TRG_3, \ldots,$ and $TRG_M$ to the second oscillation circuit $PG_2$, the third oscillation circuit $PG_3, \ldots,$ and the M-th oscillation circuit $PG_M$, and the second oscillation circuit $PG_2$, the third oscillation circuit $PG_3, \ldots,$ and the M-th oscillation circuit $PG_M$ sequentially output $Phase_2$, $Phase_3, \ldots,$ and $Phase_M$. The counter circuits 14(1), 14(2), . . . , and 14(M) count $Phase_1, Phase_2, \ldots,$ and $Phase_M$ until the count value reaches the upper cipher $N_2$ and output the count end signals. The selection circuit 15 selects the counting circuit corresponding to the lower cipher $N_2$, and outputs the timing signal TS corresponding to the value N1N2 obtained by combining the value of the upper cipher $N_1$ and the value of the lower cipher $N_2$.

Figure 24:
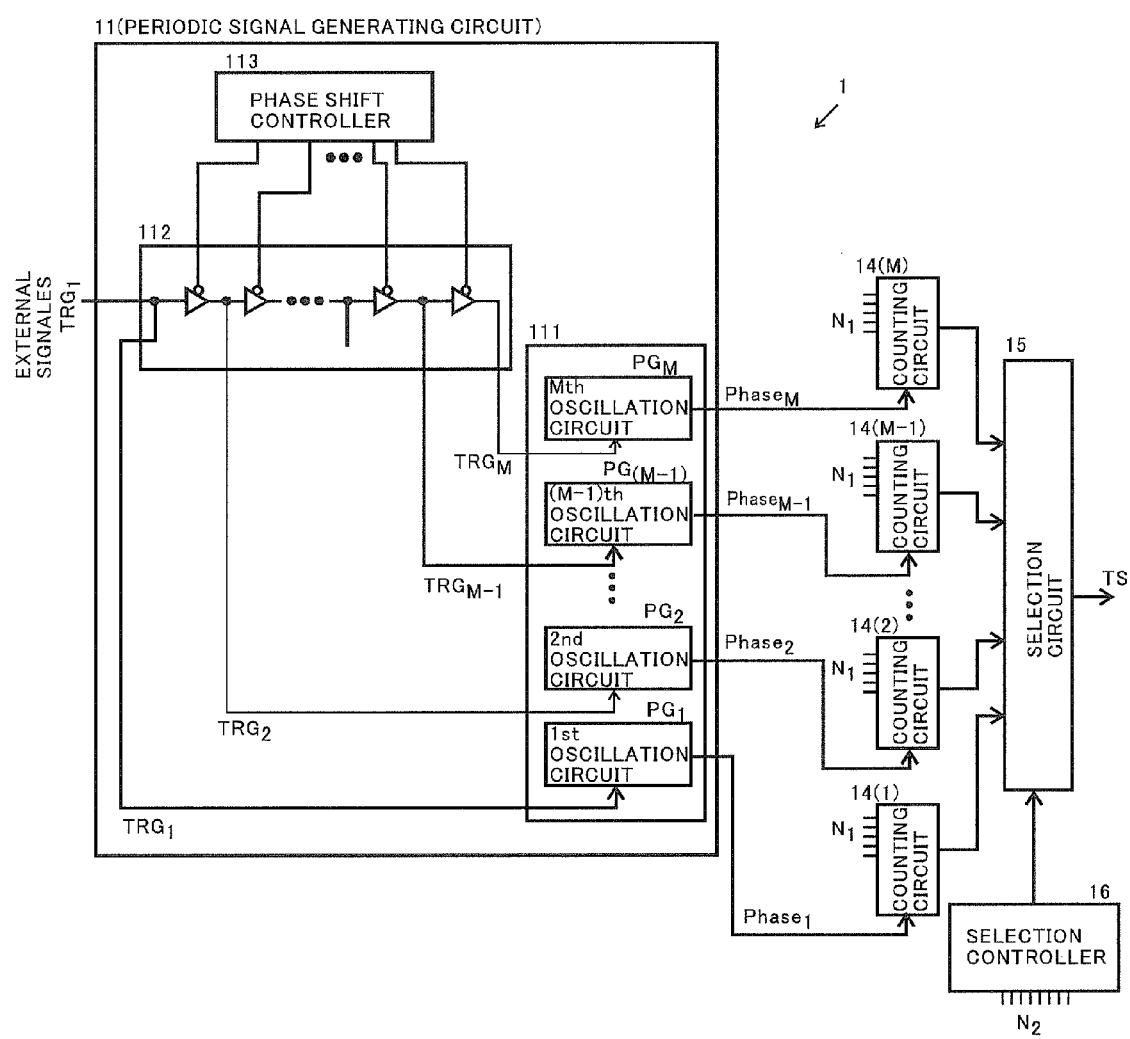
FIG. 24 is a circuit diagram illustrating another specific example of the timing generating circuit shown in FIG. 21.

FIG. 24 is a circuit diagram illustrating another specific example of the timing generating circuit shown in FIG. 21. In FIG. 24, an external signal ES is used as the driving signal $TRG_1$ of the first oscillation circuit $PG_1$ and inputs the external signal ES to the phase shift circuit 112 to generate the driving signals $TRG_2, TRG_3, \ldots,$ and $TRG_M$.

Figure 25:
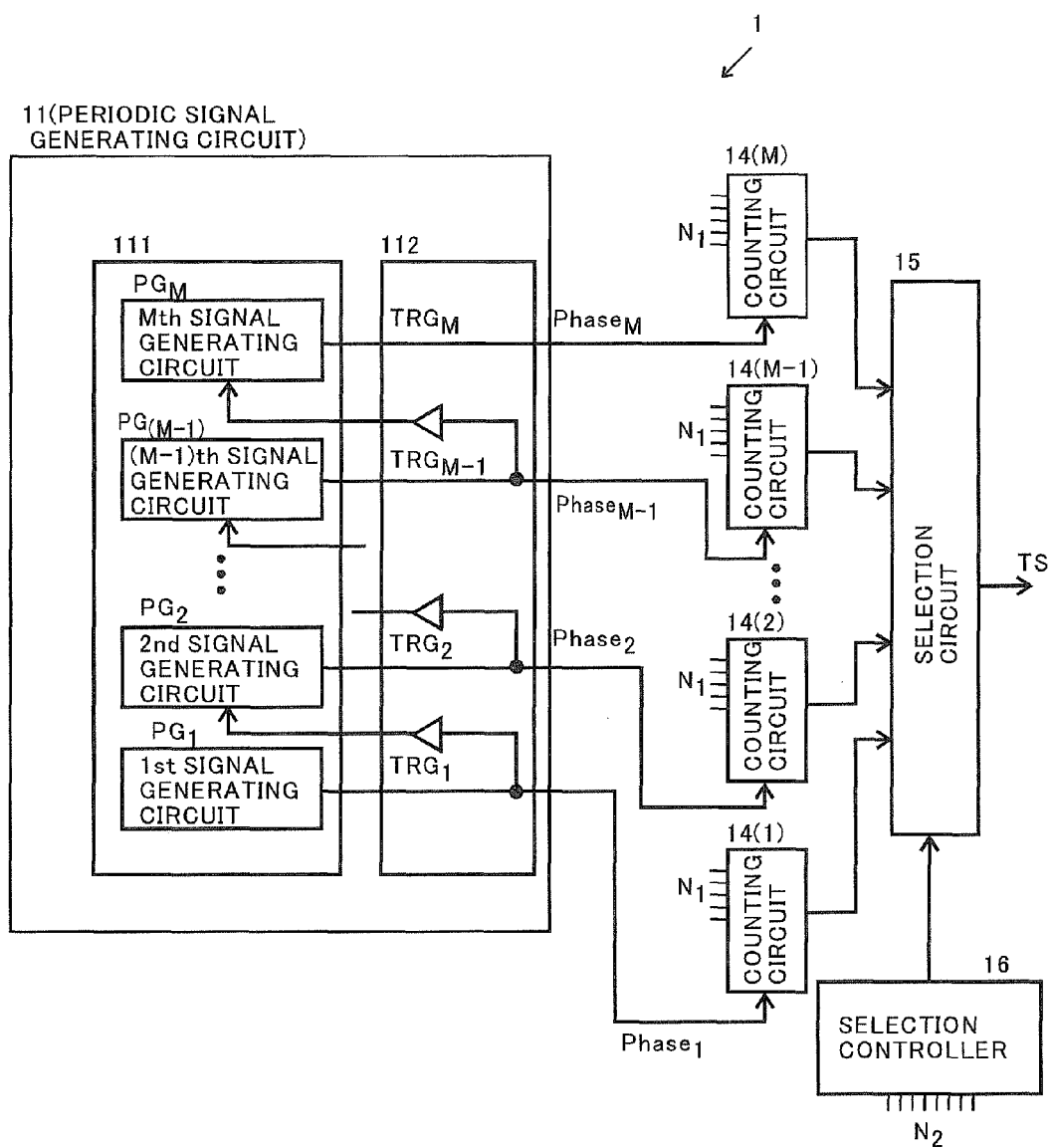
FIG. 25 is a circuit diagram illustrating another specific example of the timing generating circuit shown in FIG. 21.

FIG. 25 is a circuit diagram illustrating another specific example of the timing generating circuit shown in FIG. 21. In FIG. 25, the output of the first oscillation circuit $PG_1$ is delayed by the delay elements or the delay circuits to generate a driving signal $TRG_2$ and to drive the second oscillation circuit $PG_2$ and the output of the second oscillation circuit $PG_2$ is delayed to generate a driving signal $TRG_3$ and to drive the third oscillation circuit $PG_3$. The fourth oscillation circuit $PG_4$ to the M-th oscillation circuit $PG_M$ are driven in the same way. In FIG. 25, the delay elements or the delay circuits on the output sides of the first oscillation circuit $PG_1$ to the (M−1)-th oscillation circuit $PG_{M-1}$ constitute the phase shift circuit 112.

Figure 26:
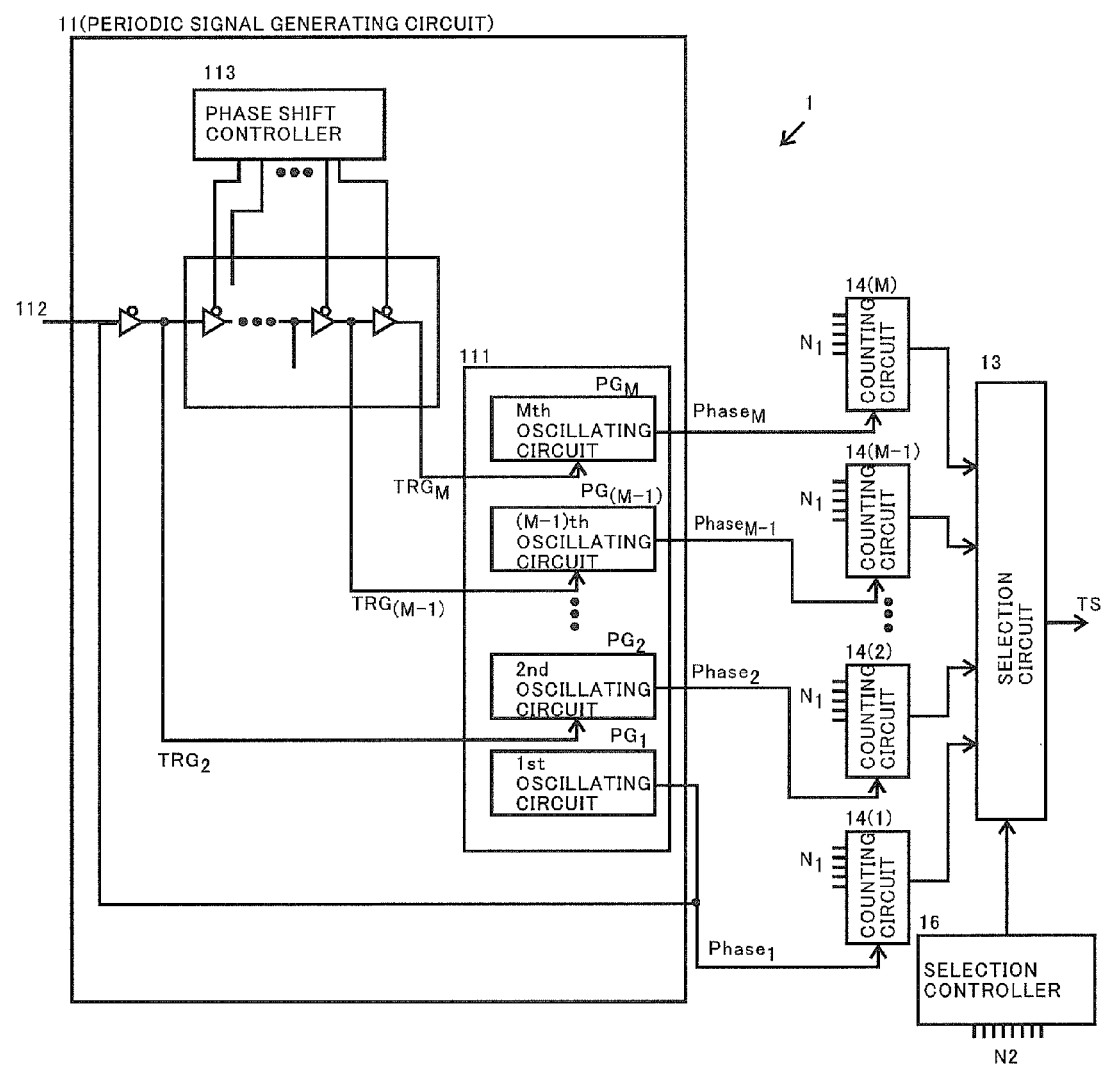
FIG. 26 is a circuit diagram illustrating another specific example of the timing generating circuit shown in FIG. 21.

FIG. 26 is a circuit diagram illustrating another specific example of the timing generating circuit shown in FIG. 21. In FIG. 26, the phase shift circuit 112 is driven by the output of the first oscillation circuit $PG_1$ shown in FIG. 23 instead of the external signal.

Figure 27:
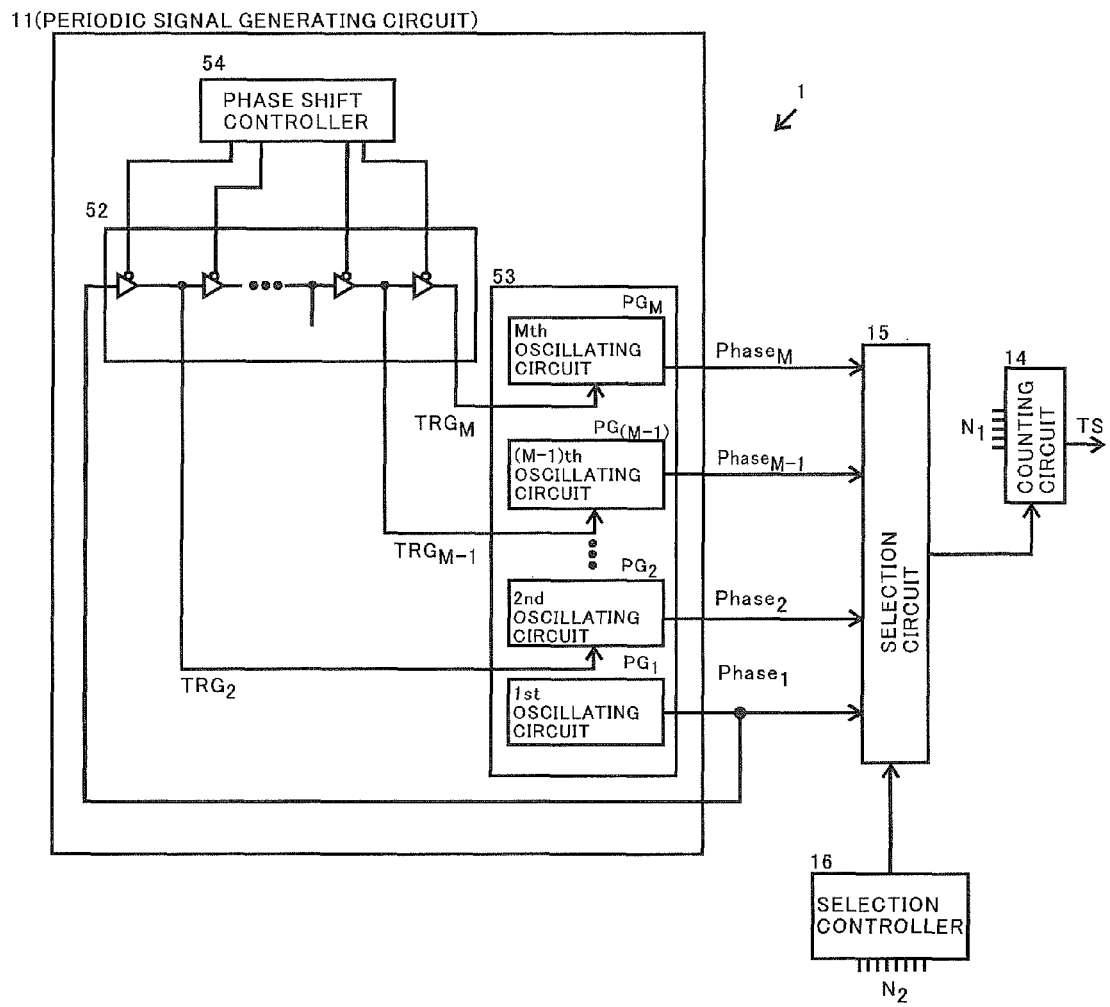
FIG. 27 is a circuit diagram specifically illustrating the timing generating circuit shown in FIG. 22.

FIG. 27 is a circuit diagram illustrating a specific example of the timing generating circuit shown in FIG. 22. In FIG. 27, the output signals $Phase_1, Phase_2, \ldots,$ and $Phase_M$ of the repeat signal generating circuit 11 are output to the selection circuit 15. The selection circuit 15 selects a signal corresponding to the lower cipher $N_2$ of the timing value and outputs the selected signal to the counter circuit 14. Since the value of the upper cipher $N_1$ is set in the counter circuit 14, the counter circuit 14 outputs the timing signal TS corresponding to a value $N_1N_2$ obtained by combining the value corresponding to the upper cipher $N_1$ and the value corresponding to the lower cipher $N_2$ by outputting the count end signal. Further, in FIG. 27, the phase shift circuit is denoted by the reference number 52, the phase shift controller is denoted by the reference number 54, and the oscillation circuit is denoted by the reference number 53.

The output of the first oscillation circuit $PG_1$ is input to the phase shift circuit 52 to generate the driving timings of the second oscillation $PG_2$ to the M-th oscillation circuit $PG_M$. However, an external signal may be input to the phase shift circuit 52 to generate the driving timings of the first oscillation circuit $PG_1$ to the M-th oscillation circuit $PG_M$ or the second oscillation circuit $PG_2$ may be driven by the use of the output of the first oscillation circuit $PG_1$, the third oscillation circuit $PG_3$ may be driven by the use of the second oscillation circuit $PG_2$, and a next-stage oscillation circuit may be sequentially driven by the use of the output of the front-stage oscillation circuit.

The delay circuits may have individual configurations. For example, an integration circuit, a gate element, a monostable multi-vibrator, or the like may be used as the delay circuit. A circuit not changing the delay time may be used as the delay circuit or it may be configured to be programmable as shown in FIGS. 28 to 31. In the delay circuits shown in FIGS. 28 to 30, a lot of delay times can be generated by weighting the delay times of the delay circuit elements (the delay elements or the delay circuits) and switching and combining the delay times by the use of switches.

When a delay circuit group including a serial connection of the delay elements or a serial connection of the delay circuits is used as the delay circuit, it may be difficult to equalize the characteristics of the delay circuit groups but it is possible to construct a delay circuit having a small error by employing the following delay circuit.

Figure 28:
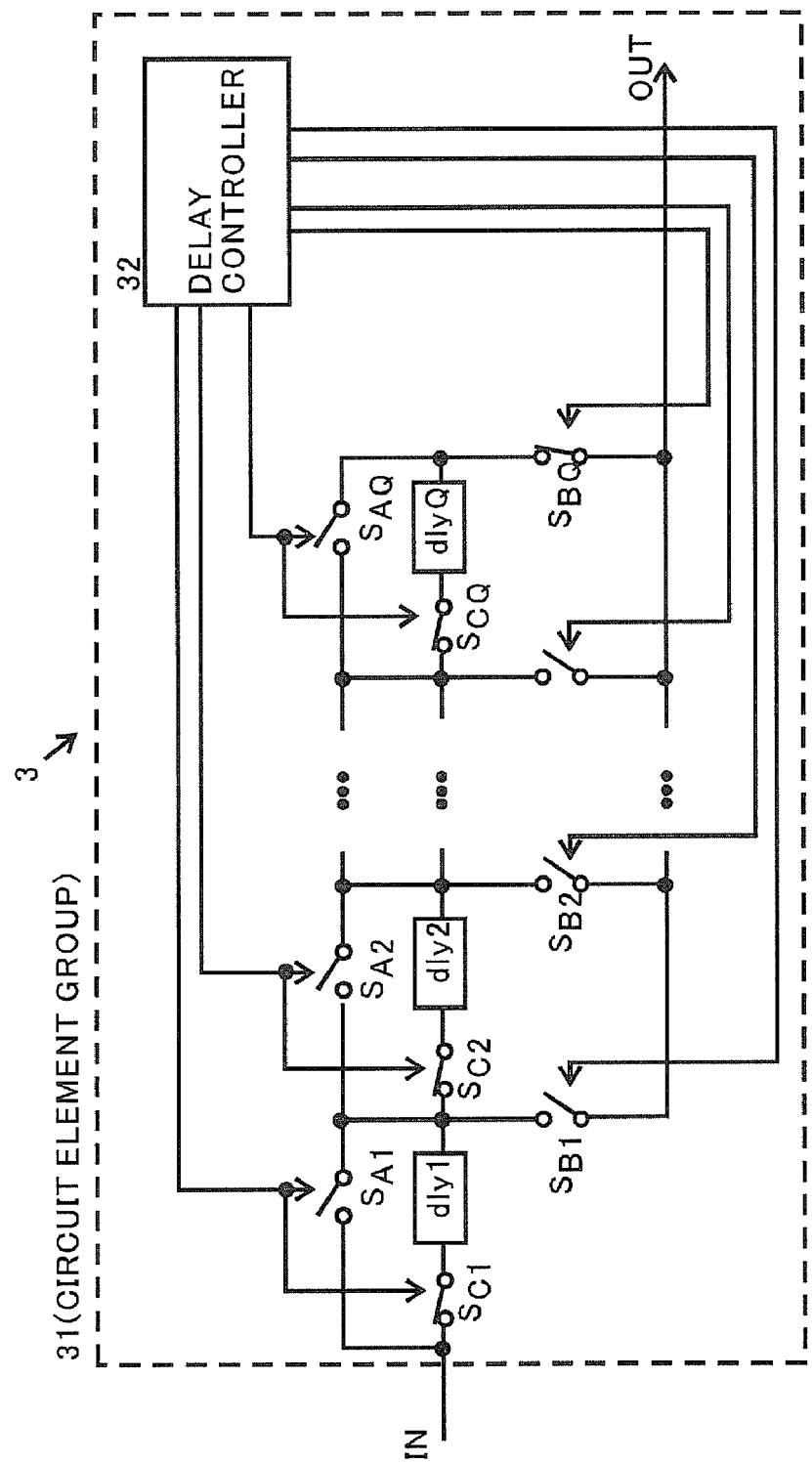
FIG. 28 is a diagram illustrating a specific example of a delay circuit according to the invention.
Figure 29:
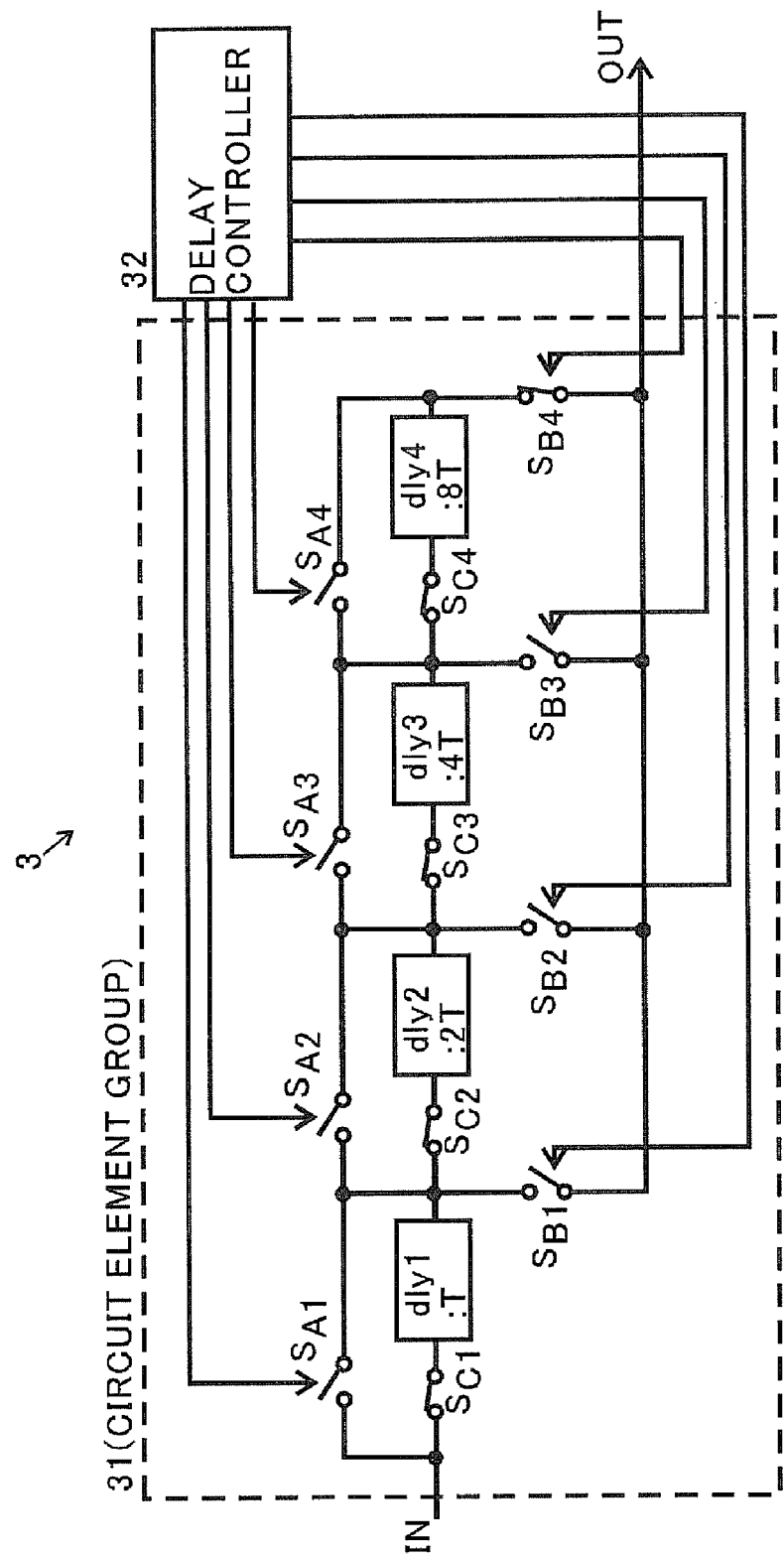
FIG. 29 is a diagram illustrating another specific example of the delay circuit according to the invention.

In FIG. 28, the delay circuit 3 includes a circuit element group 31 and a delay controller 32. The delay circuit 3 may include (a) a serial-connection circuit group (represented by $dly_1$ to $dly_Q$ in FIG. 28) including Y−1 first delay circuits with a delay time $T \cdot Y^0$, Y−1 second delay circuits with a delay time of $T \cdot Y^1$, . . . , and Y−1 P-th delay circuits with a delay time of $T \cdot Y^{P-1}$, (b) a bypass switch group (represented by $S_{A1}, S_{A2}, \ldots,$ and $S_{AQ}$ in FIG. 28) including Y−1 first bypass switches connected between both terminals of the first delay circuits, Y−1 second bypass switches connected between both terminals of the second delay circuits, . . . , and Y−1 P-th bypass switches connected between both terminals of the P-th delay circuits, and (c) an output switch group (represented by $S_{B1}, S_{B2}, \ldots,$ and $S_{BQ}$ in FIG. 28) including Y−1 first output switches connected between a terminal apart from a signal input side of the first delay circuits and a signal output terminal, Y−1 second output switches connected between a terminal apart from a signal input side of the second delay circuits and a signal output terminal, . . . , and Y−1 P-th output switches connected between a terminal apart from a signal input side of the P-th delay circuits and a signal output terminal.

In this case, short-circuit preventing switches $S_{C1}, S_{C2}, \ldots,$ and $S_{CQ}$ being turned on or off in synchronization with the bypass switches $S_{A1}, S_{A2}, \ldots,$ and $S_{AQ}$ of the delay circuits can be connected in series to the delay circuits $dly_1$ to $dly_Q$. The short-circuit prevent switch $S_{Ck}$ (where k=1, 2, . . . , and Q) is turned off when the bypass switch $S_{Ak}$, (where k=1, 2, . . . , and Q) is turned on, and is turned on when the bypass switch $S_{Ak}$ (where k=1, 2, . . . , and Q) is turned off.

When Y=5, a circuit generating delay times of T to 124T can be configured, for example, by the serial-connection delay circuit group of the delay circuits with four delay times $T \cdot 5^0$, four delay times $T \cdot 5^1$, and four delay times $T \cdot 5^2$.

FIG. 28 is a diagram illustrating the delay circuit with Y=2. In FIG. 27, the delay circuit 3 includes the circuit element group 31 and the delay controller 32. The circuit element group 31 includes Q delay circuits $dly_1$ to $dly_Q$ and switch groups $S_{A1}$ to $S_{AQ}$ and $S_{B1}$ to $S_{BQ}$ and the delay circuits $dly_1$ to $dly_Q$ can generate the delay times of $2^0 \cdot T$, and $2^1 \cdot T$, . . . , and $2^{M-1} \cdot T$. The delay controller 32 controls the turning-on or off of the switch groups $S_{A1}$ to $S_{AQ}$ and $S_{B1}$ to $S_{BQ}$ to combine the switches as shown in FIG. 31 and to generate the delay times of 0, T, 2T, . . . , and $2^{M-1}T$.

That is, when Y=2, the number of delay circuits with the same delay time need not be two or more, the delay circuit can generate the maximum delay time of 15T, and an advantage similar to that when 15 delay circuits with the delay time T are connected in series can be obtained. Similarly, an advantage similar to that when 1023 delay circuits in maximum are connected in series can be obtained using 10 delay circuits.

Figure 30:
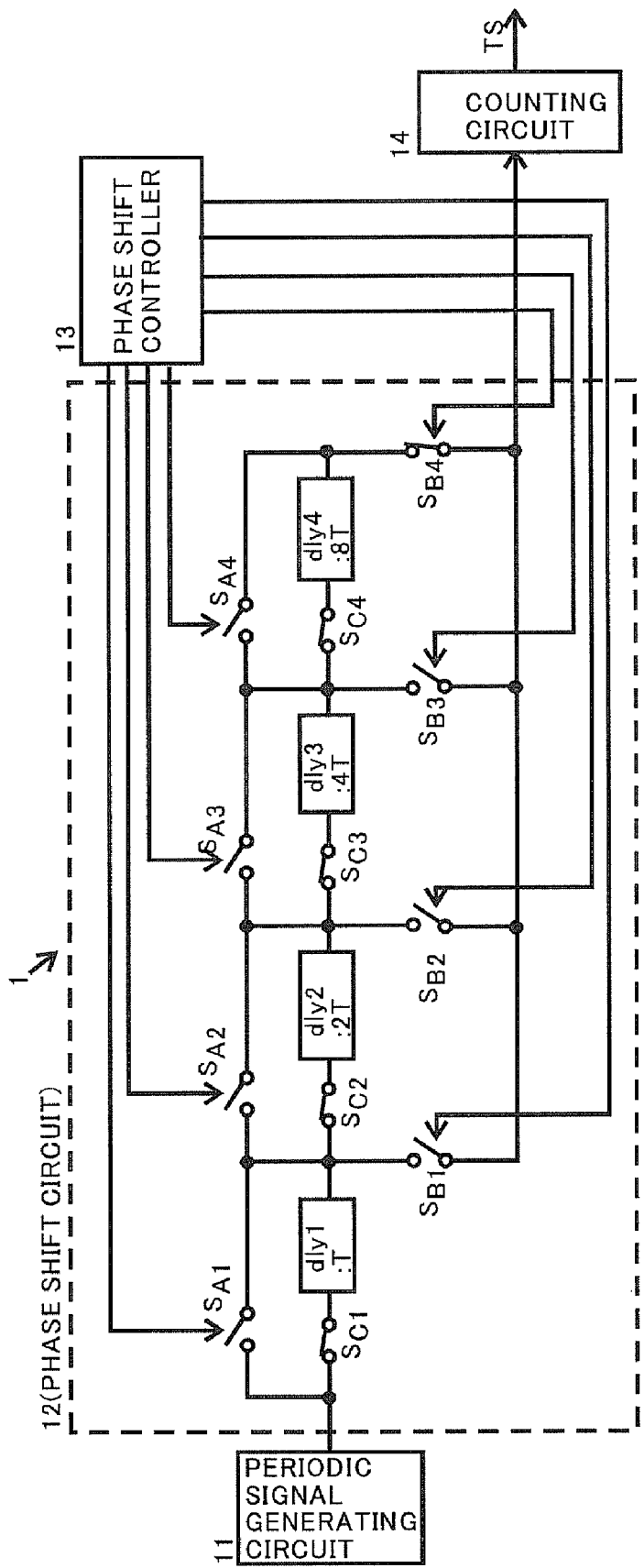
FIG. 30 is a diagram illustrating an example of a phase shift circuit employing the circuit shown in FIG. 28.

FIG. 30 is a diagram illustrating an example of the phase shift circuit employing the circuit shown in FIG. 28. In FIG. 30, the phase sift circuit is disposed at a previous stage of the phase shift circuit 12 (that is, the circuit element group 31) and the counter circuit 14 is disposed at a subsequent stage of the phase shift circuit 11.

FIG. 31 is a diagram illustrating a relation between the delay times of the signals output from the timing generating circuit 3 and the ON/OFF statuses of the switch groups of the phase shift circuit 22.

Figure 32:
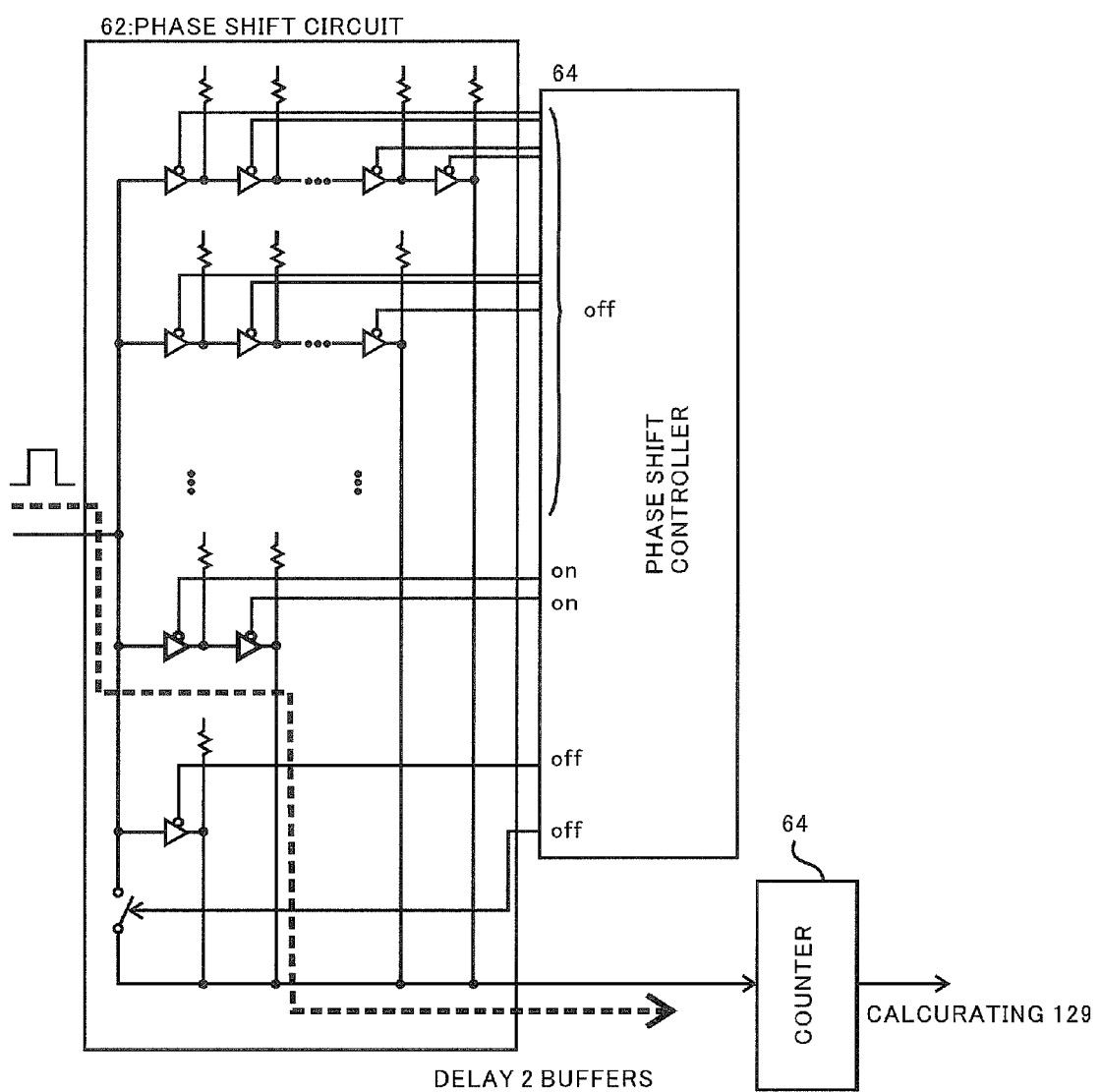
FIG. 32 is a diagram illustrating an example in order to help with understanding, in which one period is assumed to be 10 μs and delayed into 10 steps from 0 μs to 9 μs.
Figure 33:
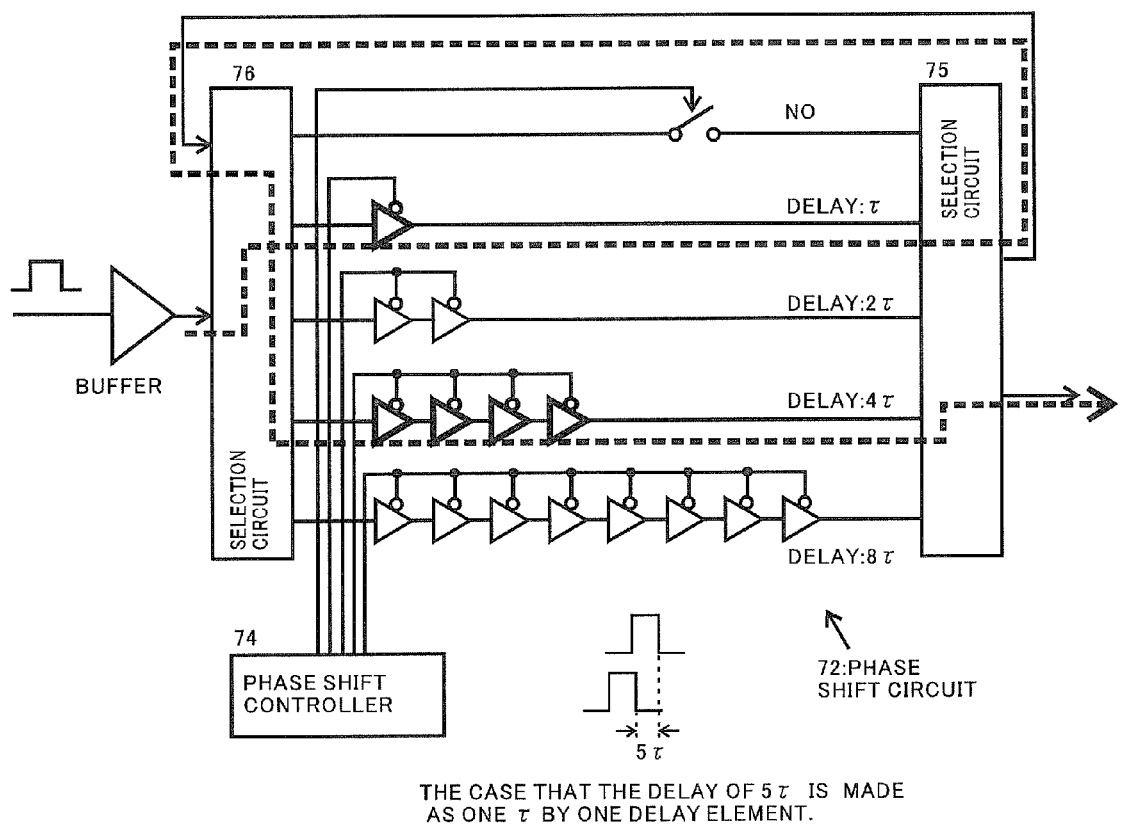
FIG. 33 is a diagram illustrating an example where two selection circuit 75 and 76 are used to generate a signal of 5τ delays by setting one delay to τ.

FIGS. 32 and 33 are diagrams in order to help with understanding the invention.

In FIG. 32, it is assumed that one period is 10 µs and a signal can be delayed into 10 steps from 0 µs to 9 µs by selecting a path. When it is counted up to 1292 µs, the phase shift circuit delays the signal by 2, and the counter 62 counts 129. Therefore, a time of 1292 µs can be counted. Since the phase shift controller 64 turns on a necessary path for delaying, the power saving can be achieved. In addition, in FIG. 33, two selection circuits 75 and 76 are used, so that 5τ delays can be generated by setting one delay to τ.

Figure 34:
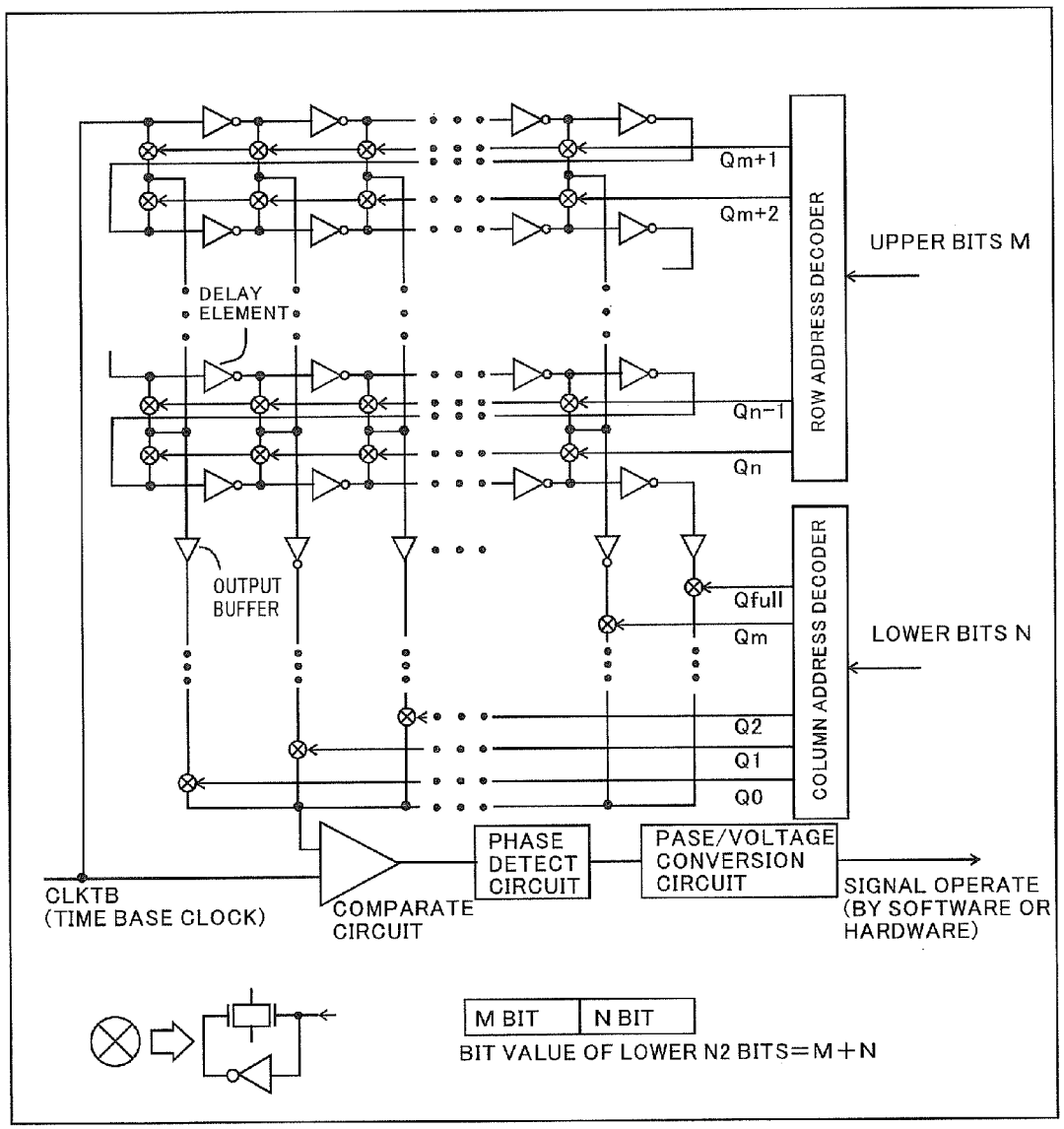
FIG. 34 is a diagram illustrating a specific example of the timing generating circuit employing a matrix.
Figure 35:
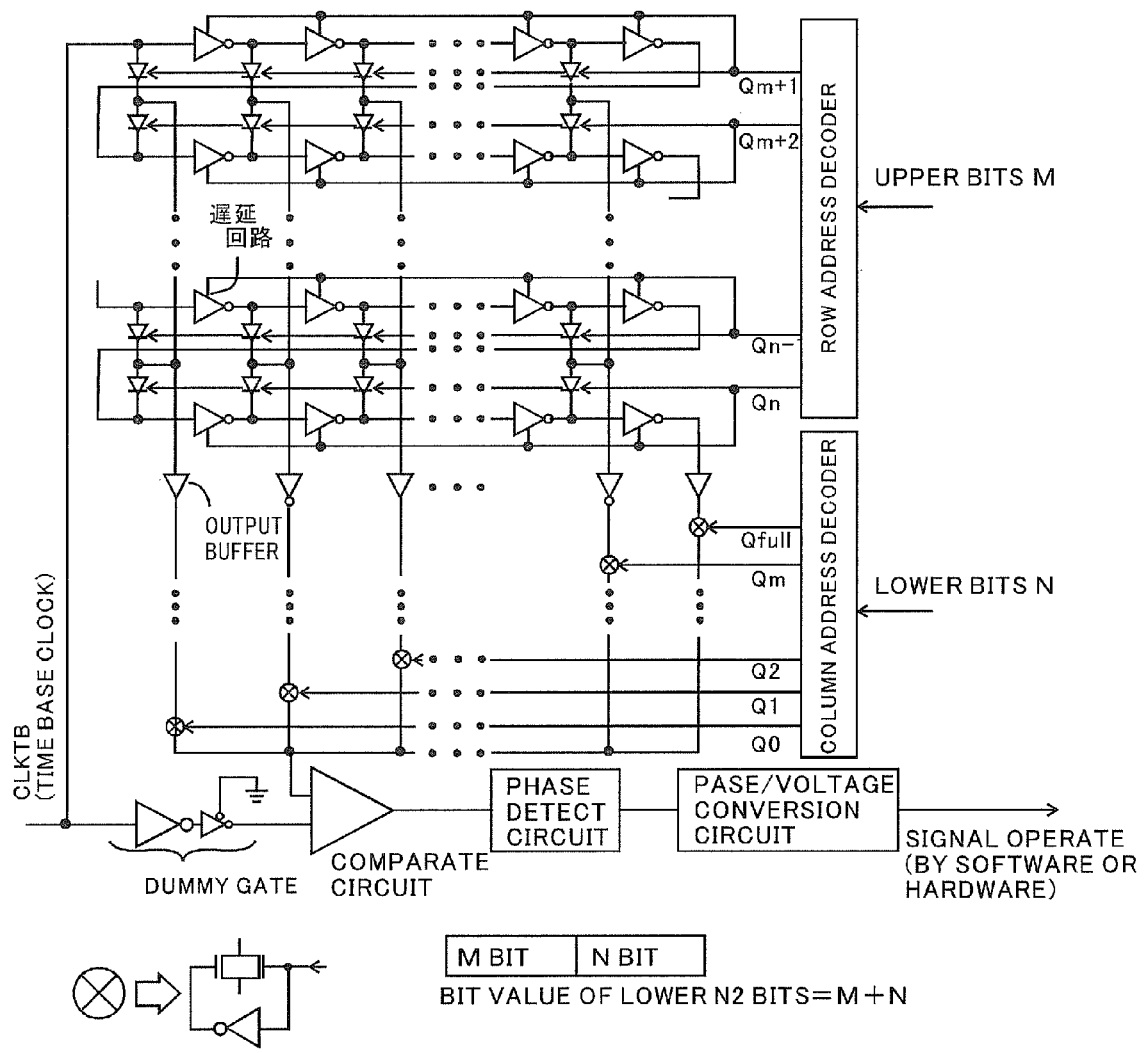
FIG. 35 is a diagram illustrating a specific example of another timing generating circuit employing a matrix.

FIGS. 34 and 35 show specific examples of the timing generating circuit employing a matrix.

In FIG. 34, the delay gates are arranged in a matrix shape, and a target delay time at an X-Y address is selected. There is an advantage that the loads of the respective delay gates are uniform.

In one direction arrangement type (this example), decoding is carried out in which the lower row of the selected address is in a selected state. In addition to the one direction arrangement type (this example), a meandering type (correction of a column decoding at EVN/ODD of a row address) may be employed. In addition, the delay gate of the 3-state output type is used to turn off the gates not used, so that the power consumption can be reduced. In this case, the output of each gate is connected to a pull-up resistor.

In addition, in order to achieve the uniformity of the rising delay and the falling delay, the polarity may be matched by an output buffer which replaces the inverter with a non-inverting type gate to adjust a value of the pull-up resistor.

In FIG. 35, by using the clocked gate as the column selection gate, each delaying gate is uniformly added and the deviation in the delay time is small.

The delay gate of the 3-state outputting type is used to turn off the gates not used in the unit of column delay circuit, so that the power consumption can be reduced. In addition, the clocked gate may be used as the row selection switch.

FIGS. 36(A) to 36(D) show specific examples of the delay circuit.

The invention claimed is:

1. A timing generating circuit generating a predetermined timing of a processing signal, comprising a phase shift circuit, a phase shift controller, and a counter circuit, wherein
   (A) the phase shift circuit receiving a repeat signal generates a signal of which a phase is shifted by a predetermined quantity on the basis of the repeat signal,
   (B) the phase shift controller controls the phase shift circuit to output one of first to M-th signals of which phases are differently shifted each other, and
   (C) the counter circuit counts the number of output signals of the phase shift circuit and generates a count end signal (which is a signal output after counting up or down is ended) when a count value reaches a set value,
   whereby the counter circuit outputs a synthesized timing signal including a timing of the repeat signal and a timing shifted by the phase shift circuit,
   wherein the timing generating circuit further includes a delay circuit used in the phase shift circuit, the delay circuit comprising:
   a serial-connection delay circuit group including Q delay circuits having at least two different delay times,
   a bypass switch group including Q bypass switches connected between both terminals of the respective delay circuits, and
   an output switch group including Q switches connected between a terminal apart from a signal input side of the respective delay circuits and an output terminal.

2. The timing generating circuit according to claim 1, wherein the phase shift circuit includes a serial connection or a parallel connection of delay elements or delay circuits or a serial-parallel connection as a combination thereof.

3. The timing generating circuit according to claim 1, wherein a short-circuit preventing switch being turned on or off in synchronization with the bypass switches of the delay circuits are connected in series to the delay circuits.

4. The timing generating circuit according to claim 1, wherein the delay circuits include an integration circuit manufactured on a semiconductor integrated circuit.

5. A timing generating circuit generating a predetermined timing of a processing signal, comprising a phase shift circuit, a phase shift controller, and a counter circuit, wherein
   the phase shift circuit receiving a repeat signal generates a signal of which a phase is shifted by a predetermined quantity on the basis of the repeat signal,
   the phase shift controller controls the phase shift circuit to output one of first to M-th signals of which phases are differently shifted each other, and
   the counter circuit counts the number of output signals of the phase shift circuit and generates a count end signal (which is a signal output after counting up or down is ended) when a count value reaches a set value,
   whereby the counter circuit outputs a synthesized timing signal including a timing of the repeat signal and a timing shifted by the phase shift circuit,
   wherein the timing generating circuit further includes a delay circuit used in the phase shift circuit, the delay circuit comprising:
   (a) a serial-connection delay circuit group including Y−1 first delay circuits with a delay time of $T \cdot Y^0$, Y−1 second delay circuits with a delay time of $T \cdot Y^1$, ..., and Y−1 P-th delay circuits with a delay time of $T \cdot Y^{P-1}$,
   (b) a bypass switch group including Y−1 first bypass switches connected between both terminals of the first delay circuits, Y−1 second bypass switches connected between both terminals of the second delay circuits, ..., and Y−1 P-th bypass switches connected between both terminals of the P-th delay circuits, and
   (c) an output switch group including Y−1 first output switches connected between a terminal apart from a signal input side of the first delay circuits and a signal output terminal, Y−1 second output switches connected between a terminal apart from a signal input side of the second delay circuits and a signal output terminal, ..., and Y−1 P-th output switches connected between a terminal apart from a signal input side of the P-th delay circuits and a signal output terminal.

6. The timing generating circuit according to claim 5, wherein Y=2.

* * * * *